(12) United States Patent
Rajoo et al.

(10) Patent No.: US 9,768,089 B2
(45) Date of Patent: Sep. 19, 2017

(54) WAFER STACK PROTECTION SEAL

(71) Applicant: GLOBALFOUNDRIES Singapore Pte. Ltd., Singapore (SG)

(72) Inventors: Ranjan Rajoo, Singapore (SG); Kai Chong Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/224,680

(22) Filed: Aug. 1, 2016

(65) Prior Publication Data

US 2016/0343629 A1    Nov. 24, 2016

Related U.S. Application Data

(63) Continuation-in-part of application No. 14/201,935, filed on Mar. 10, 2014, now Pat. No. 9,406,577.

(Continued)

(51) Int. Cl.
*H01L 23/10* (2006.01)
*H01L 21/683* (2006.01)

(Continued)

(52) U.S. Cl.
CPC .......... *H01L 23/10* (2013.01); *H01L 21/6835* (2013.01); *H01L 24/02* (2013.01); *H01L 24/24* (2013.01); *H01L 24/29* (2013.01); *H01L 24/30* (2013.01); *H01L 24/73* (2013.01); *H01L 24/82* (2013.01); *H01L 24/92* (2013.01); *H01L 24/94* (2013.01); *H01L 21/561* (2013.01); *H01L 24/03* (2013.01); *H01L 24/05* (2013.01);

(Continued)

(58) Field of Classification Search
CPC ........ H01L 23/10; H01L 24/29; H01L 24/30; H01L 24/89; H01L 24/05; H01L 24/13; H01L 24/27; H01L 24/03; H01L 24/11; H01L 24/92–24/94; H01L 2224/2124; H01L 2224/83; H01L 2224/94; H01L 2224/30505; H01L 2224/1319; H01L 2224/83859; H01L 21/6835; H01L 21/561
See application file for complete search history.

(56) References Cited

U.S. PATENT DOCUMENTS 7,067,397 B1 *   6/2006   Chang-Chien ........ B81B 7/0064
                                                        438/106
7,528,481 B2 *   5/2009   Kim ..................... B81C 1/00301
                                                        257/704

(Continued)

*Primary Examiner* — Michael Trinh
(74) *Attorney, Agent, or Firm* — Horizon IP Pte. Ltd.

(57) ABSTRACT

A semiconductor wafer stack and a method of forming a semiconductor device is disclosed. The method includes providing a wafer stack with first and second wafers bonded together. The wafers include edge and non-edge regions, and at least one of the first and second wafers includes devices formed in the non-edge region. The first wafer serves as the base wafer while the second wafer serves as the top wafer of the wafer stack, where the base wafer is wider than the top wafer, providing a step edge of the wafer stack. An edge protection seal is formed on the wafer stack, where first and second layers are deposited on the wafer stack including at the top wafer and step edge of the wafer stack. The portion of the first and second layers on the step edge of the wafer stack forms the edge protection seal which protects the devices in the wafer stack in subsequent processing.

20 Claims, 19 Drawing Sheets

Related U.S. Application Data

(60) Provisional application No. 61/778,465, filed on Mar. 13, 2013.

(51) Int. Cl.
*H01L 21/56* (2006.01)
*H01L 23/00* (2006.01)

(52) U.S. Cl.
CPC .............. *H01L 24/11* (2013.01); *H01L 24/13* (2013.01); *H01L 24/27* (2013.01); *H01L 24/83* (2013.01); *H01L 2221/68327* (2013.01); *H01L 2224/0239* (2013.01); *H01L 2224/02311* (2013.01); *H01L 2224/02331* (2013.01); *H01L 2224/02371* (2013.01); *H01L 2224/02372* (2013.01); *H01L 2224/03002* (2013.01); *H01L 2224/04042* (2013.01); *H01L 2224/131* (2013.01); *H01L 2224/13024* (2013.01); *H01L 2224/245* (2013.01); *H01L 2224/24051* (2013.01); *H01L 2224/2732* (2013.01); *H01L 2224/2741* (2013.01); *H01L 2224/2745* (2013.01); *H01L 2224/2761* (2013.01); *H01L 2224/27462* (2013.01); *H01L 2224/27464* (2013.01); *H01L 2224/27618* (2013.01); *H01L 2224/29011* (2013.01); *H01L 2224/29014* (2013.01); *H01L 2224/2919* (2013.01); *H01L 2224/29078* (2013.01); *H01L 2224/29111* (2013.01); *H01L 2224/29124* (2013.01); *H01L 2224/29144* (2013.01); *H01L 2224/29147* (2013.01); *H01L 2224/3003* (2013.01); *H01L 2224/3012* (2013.01); *H01L 2224/30051* (2013.01); *H01L 2224/30505* (2013.01); *H01L 2224/73103* (2013.01); *H01L 2224/73203* (2013.01); *H01L 2224/73267* (2013.01); *H01L 2224/82101* (2013.01); *H01L 2224/8309* (2013.01); *H01L 2224/83065* (2013.01); *H01L 2224/83075* (2013.01); *H01L 2224/8389* (2013.01); *H01L 2224/83191* (2013.01); *H01L 2224/83193* (2013.01); *H01L 2224/83203* (2013.01); *H01L 2224/83801* (2013.01); *H01L 2224/83805* (2013.01); *H01L 2224/83862* (2013.01); *H01L 2224/83874* (2013.01); *H01L 2224/83905* (2013.01); *H01L 2224/92* (2013.01); *H01L 2224/9211* (2013.01); *H01L 2224/94* (2013.01); *H01L 2224/97* (2013.01); *H01L 2924/01322* (2013.01); *H01L 2924/1461* (2013.01)

(56) References Cited

U.S. PATENT DOCUMENTS

| | | | | |
|---|---|---|---|---|
| 7,696,062 | B2* | 4/2010 | Chang-Chien | H01L 21/6835 438/455 |
| 7,932,161 | B2* | 4/2011 | Apanius | C08F 32/00 257/781 |
| 7,951,647 | B2* | 5/2011 | Yang | H01L 21/561 257/E21.001 |
| 8,476,165 | B2* | 7/2013 | Trickett | H01L 21/304 438/692 |
| 8,778,778 | B2* | 7/2014 | Tanida | H01L 27/1464 257/228 |
| 8,975,157 | B2* | 3/2015 | Hsiao | H01L 21/6835 438/455 |
| 2007/0048969 | A1* | 3/2007 | Kwon | H01L 21/76898 438/455 |
| 2012/0074554 | A1* | 3/2012 | Cheng | B81C 1/00269 257/684 |
| 2013/0260510 | A1* | 10/2013 | Theuss | H01L 25/0657 438/109 |
| 2013/0285240 | A1* | 10/2013 | Last | H01L 23/481 257/738 |

* cited by examiner

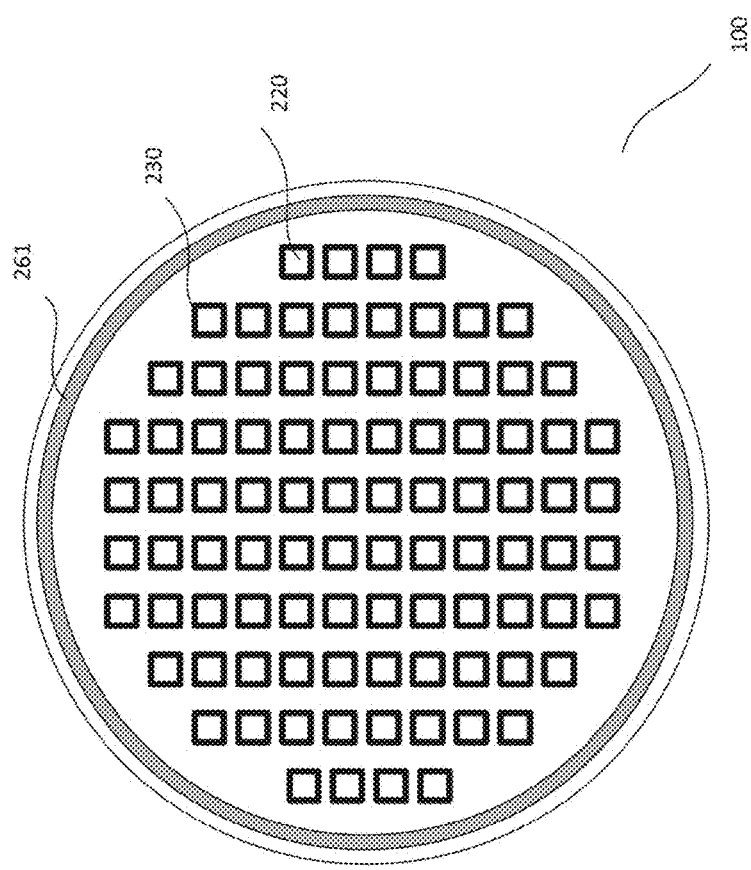

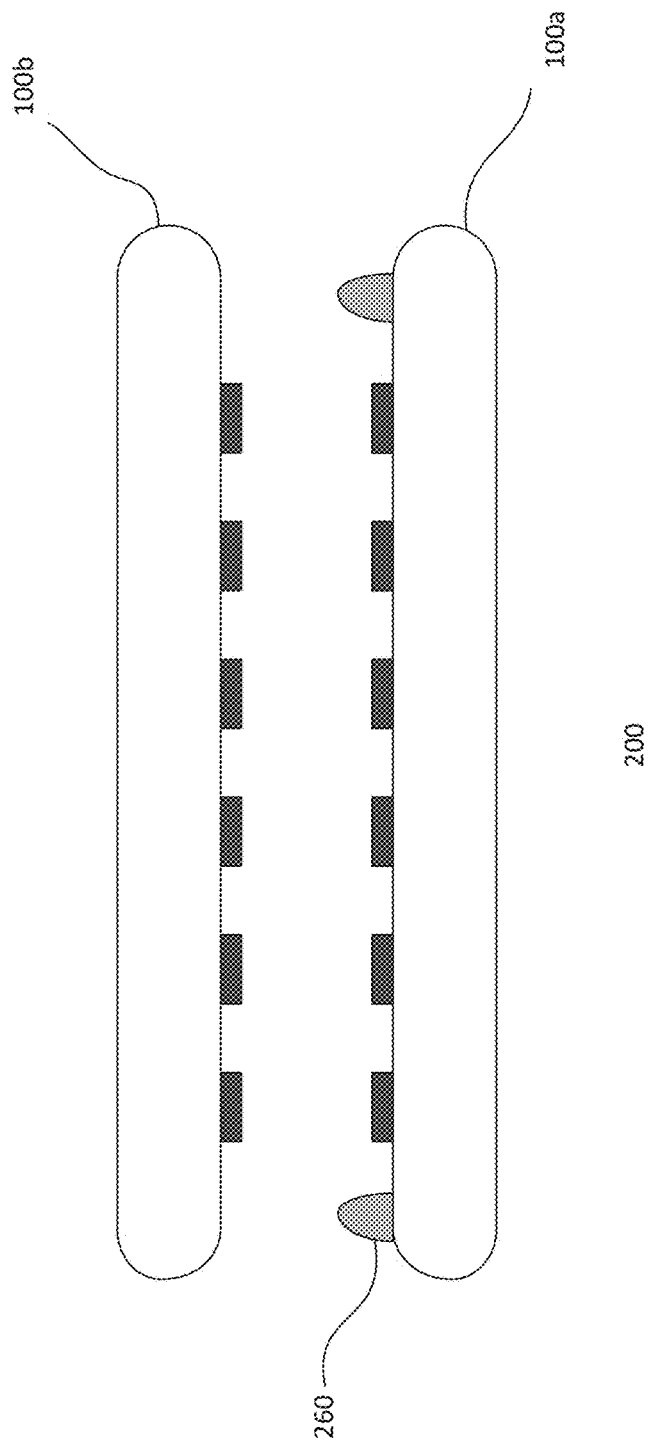

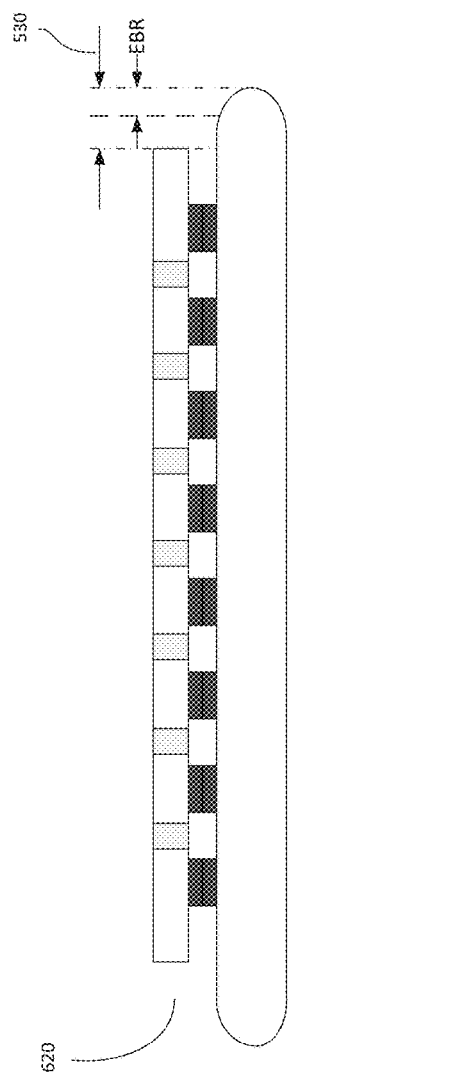

WAFER STACK PROTECTION SEAL

CROSS-REFERENCE TO RELATED APPLICATIONS

This application is a continuation-in-part application of U.S. patent application Ser. No. 14/201,935, now U.S. Pat. No. 9,406,577, filed on Mar. 10, 2014, entitled "Wafer Stack Protection Seal", which relies on the priority benefit of Provisional Application Ser. No. 61/778,465, filed on Mar. 13, 2013, entitled "Wafer Level Sealing Ring Structures for Semiconductor Devices", the disclosures of which are herein incorporated by reference in their entireties for all purposes.

BACKGROUND

Wafer bonding is commonly employed for wafer level 3-D packaging. For example, two wafers are bonded together prior to dicing. After the wafers are bonded to form a wafer stack, the wafer stack is subjected to wafer bumping processing which forms external connections. Conventional wafer bumping processing has been found to cause damage to the wafer stack. For example, chemicals used in wafer bumping processing may damage interconnections between the wafers. Such damages adversely affect reliability and yield.

From the foregoing discussion, it is desirable to provide a wafer stack that avoids damage caused by, for example, wafer bumping processing.

SUMMARY

Embodiments generally relate to semiconductor device and methods for forming semiconductor devices. In an embodiment, a method of forming a semiconductor device is disclosed. The method includes providing first and second wafers with top and bottom surfaces. The wafers include edge and non-edge regions, and the first wafer includes devices formed in the non-edge region. A first protection seal may be formed at the edge region of the first wafer. The first and second wafers may be further bonded to form a device stack. The protection seal in the device stack contacts the first and second wafers to form a seal, and protects the devices in subsequent processing.

In another embodiment, a semiconductor wafer stack is disclosed. The semiconductor wafer stack includes first and second wafers with top and bottom surfaces. The wafers have edge and non-edge regions, and the first wafer includes devices formed in the non-edge region. The semiconductor wafer stack further includes a protection seal disposed at the edge region of the wafer stack in between the first and second wafers. The protection seal in the device stack contacts the first and second wafers and forms a seal protecting the devices in the wafer stack.

In yet another embodiment, a method for forming an edge protection seal on a semiconductor wafer stack is disclosed. The method includes providing a wafer stack with first and second wafers bonded together. The wafers include edge and non-edge regions, and at least one of the first and second wafers includes devices formed in the non-edge region. The first wafer serves as the base wafer while the second wafer serves as the top wafer of the wafer stack, where the base wafer is wider than the top wafer, providing a step edge of the wafer stack. An edge protection seal is formed on the wafer stack, where first and second layers are deposited on the wafer stack including at the top wafer and step edge of the wafer stack. The portion of the first and second layers on the step edge of the wafer stack forms the edge protection seal which protects the devices in the wafer stack in subsequent processing.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-c show plan and side views of various embodiments of a semiconductor wafer;

FIGS. 2a-b show an embodiment of a process for stacking wafers;

FIGS. 6a-g show an embodiment of a process for a forming an edge protection seal on a wafer stack.

DETAILED DESCRIPTION

Embodiments generally relate to devices and methods for forming devices. The devices may be, for example, semiconductor devices. For example, the semiconductor devices may be integrated circuits. In other embodiments, the devices may be other types of devices, such as microelectromechanical system (MEMS) devices. In yet other embodiments, the devices may be optoelectronic devices. Embodiments may be employed to form stacked devices, for example, multiple devices stacked together to form a device stack. The device stack may include semiconductor devices. The devices of the stack may be the same type of device. In other embodiments, the device stack may be a combination of different types of devices, for example, IC and MEMS devices stacked together.

The devices may be incorporated into or used with, for example, CMOS products, electronic products, computers, cell phones, and personal digital assistants (PDAs). The devices may also be incorporated into other types of products. In general, the embodiments are further applicable to wafer-to-chip and chip-to-chip bonding, including MEMS, semiconductor IC or other hybrid devices. The embodiments employ a protection seal to protect the edges of a wafer and to minimize or avoid contamination during subsequent processes.

Figure 1B:
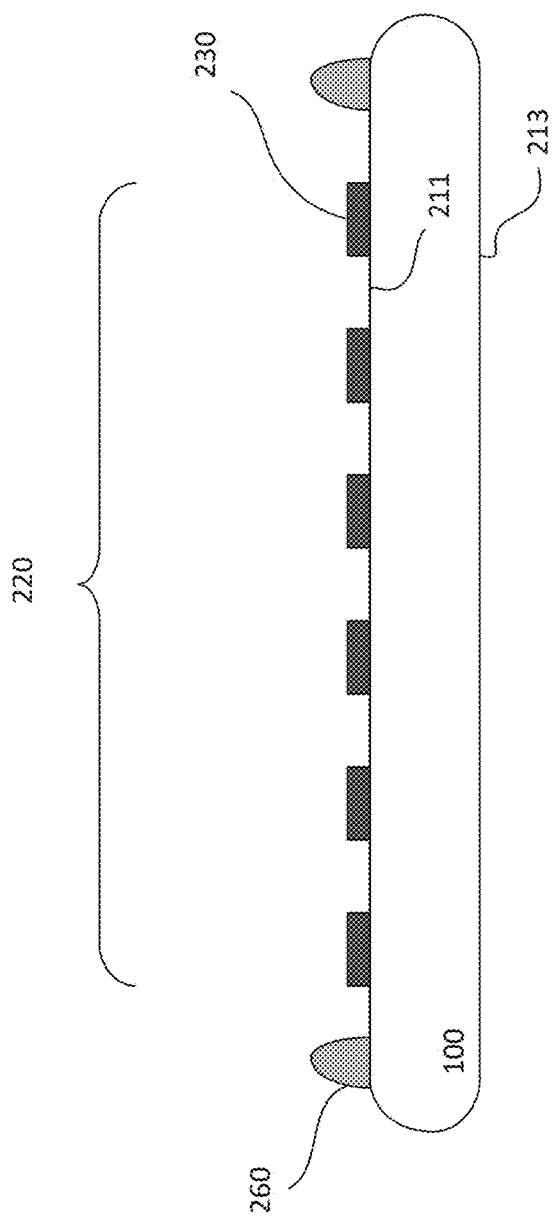
Figure 1C:
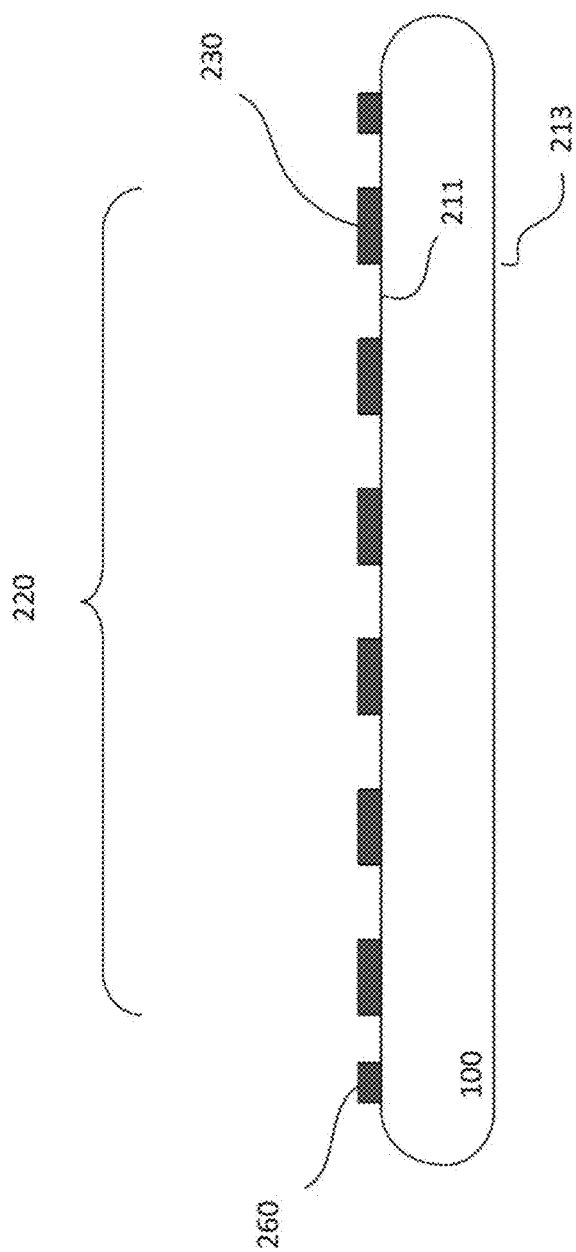

FIG. 1a shows a simplified plan view of an embodiment of a semiconductor wafer 100 while FIGS. 1b-c show corresponding side views of various embodiments of the semiconductor wafer. The semiconductor wafer, for example, may be a silicon wafer. Other types of wafers may also be useful. For example, the wafer may be a germanium (Ge), silicon-germanium alloy (SiGe), silicon-on-insulator (SOI), silicon-on-sapphire (SOS), gallium-arsenic (GaAs) or any other suitable semiconductor materials. The edge of the wafer may be beveled or rounded, as shown. Other types of edges may also be useful. The wafer, as shown, has a circular shape. Depending on the type of device, the wafer may include a notch (not shown) to indicate the crystal orientation of the wafer. Other techniques for indicating the crystal orientation may also be useful. Additional indicators may also be included to indicate the dopant type of the wafer.

The wafer, in one embodiment, is a processed wafer. For example, devices 220 are located on an active surface 211 of the processed wafer. The active surface may be referred to as the top surface while the opposing surface may be the inactive or bottom surface 213. The devices, for example, are formed in parallel. The devices, for example, are arranged in rows along a first (x) direction and columns along a second (y) direction. As shown, full or complete devices are disposed on the active surface. For example, complete devices are disposed in a device or die region on the active surface of the wafer. An edge region surrounds the device region. The edge region may be devoid of devices. In some cases, incomplete devices may be included in the edge region. Incomplete devices are included to, for example, improve processing uniformity. The edge region may have a width of about 1-5 mm. In some instances, the width of the edge region may be uneven. The edge region may have a minimum width of, for example, about 100 um. Other configuration of devices on the wafer may also be useful.

In one embodiment, the wafer is prepared for bonding with another wafer. Bonding two or more wafers together forms a wafer stack. To facilitate wafer stacking, the wafer may include through silicon via (TSV) contacts (not shown). At this stage of processing, the TSV contacts are partially processed. For example, the TSV contacts extend from the active (or top) surface and partially through the wafer. In other words, the bottom of the TSV contacts do not extend through to the inactive (or bottom) surface of the wafer. The top of the TSV contacts at the active surface may be exposed. In other embodiments, the top of the TSV contacts may not be exposed and may be exposed at a later stage of processing.

Additional preparation may include, for example, providing device seals 230. A device seal surrounds a device. The device seals, for example, may be a metal, such as aluminum, copper, gold, tin, their alloys or a combination thereof. Other types of sealing material may also be useful. The device seals may be formed on the wafer to, for example, seal and protect the devices and interconnects on the wafer from environmental conditions of subsequent processing steps. The device seals may be formed by, for example, deposition and photolithography. Other methods for forming the device seals may also be useful. The device seals may be formed on the active surface of the wafer. In other embodiments, the device seals may be formed on a dielectric layer on the active surface of the wafer. The device seals may have a height of about 5 um. Other heights may also be useful. For example, depending on the type of seal used, the device seals may range up to hundreds of microns. The device seals may be provided for devices that are, for example, to be incorporated into or used with sensors. In other embodiments, the device seals may not be necessary.

In one embodiment, a wafer protection seal 260 is disposed on a surface of the wafer. The protection seal is disposed on the mounting surface of the wafer. The mounting surface is the surface on which another wafer is mounted. In one embodiment, the mounting surface is the active surface of the wafer. Providing other mounting surfaces may also be useful. For example, the mounting surface may be the inactive surface of the wafer.

The protection seal, in one embodiment, is formed at the periphery of the wafer. The protection seal is disposed on the edge region outside of the die region. The protection seal may be aligned with a slight gap from the circumferential edge of the wafer. Providing the protection seal in the edge region avoids interfering with the devices. In one embodiment, the protection seal includes a ring structure 261. The ring structure, for example, is a continuous ring structure. The ring, as shown, is circular. Providing a protection seal having other shapes may also be useful. For example, the ring may be a serpentine or zigzag ring. Other suitable patterns may also be useful.

In one embodiment, the protection seal is a pliable protection seal, as shown in FIG. 1b. In one embodiment, the pliable protection seal is a polymeric protection seal. Other types of pliable protection seals may also be useful. Various types of polymers may be used. For example, the polymer may include polyimide, polysulfone, lead (II) oxide (PbO), or benzocyclobutene (BCB). Other types of polymeric materials may also be useful. The pliable seal is disposed on the edge portion of the wafer.

The protection seal has a height that enables sealing of the wafers when bonded. As shown, a height of the protection seal 260 is higher than a height of the device seals 230. In the case where the protection seal is provided on only one of the wafers to be bonded, the height is greater than the final gap between the bonded wafers. The gap between the bonded wafers may be about 5 um. Other gap widths may also be useful. For example, the height of the protection seal may be 10-40% greater than the final gap of the bonded wafers. For the case where protection seals are provided on both wafers, the height of the protection seal may be 10 to 20% greater than half the gap between the bonded wafers. Providing protection seals having other percentages of the gap or half the gap may also be useful. In some instances, the gap width may depend on the technology node. Other configurations of the protection seal 260 which enables sealing between the bonded wafers may also useful. As for the width, it enables sealing of the die region to prevent it from contamination by subsequent processing, such as wafer bumping. The width of the protection seal may be, for example, about 5 um. Other widths may also be useful.

Various techniques may be employed to form the polymer protection seal on the wafer. For example, the polymer seal may be disposed on the edge region of the wafer by dispensing. A dispenser may be used to place the polymer on the edge region of the wafer. Other techniques may include, for example, coating, spraying or brushing and printing. In some implementations, the polymeric protection seal may be formed of a photo-imageable polymer. In such instances, the photo-imageable polymer may be subjected to a lithography process after deposition of the polymer. Other techniques for forming the polymeric protection seal may also be useful.

In another embodiment, as shown in FIG. 1c, the protection seal is formed of a rigid material. In one embodiment, the protection seal is formed of a metal, such as aluminum, copper, gold, tin, their alloys or a combination thereof. Preferably, the protection seal is formed of the same material as the device seals. As shown, the rigid protection seal has the same height as the device seals. A width of the protection seal enables protection of the device region from contamination by subsequent processing. The width of the protection seal, for example, may be about 2 microns. Other widths may also be useful. The protection seal may be formed by, for example, electro-plating, sputtering, evaporations or electroless plating followed by a lithography process. The protection seal may be formed in the same step as patterning the device seals. For example, the sealing material is formed on the wafer surface and patterned to form the device seals and protection seal or seals. Forming the device seals and protection seals in separate processes may also be useful. Other configurations or materials for the protection seal may also be useful. For example, in the case the protection seal is formed of a different material than that of the device seals, separate processes are used to form the device seals and protection seal.

Figure 2B:
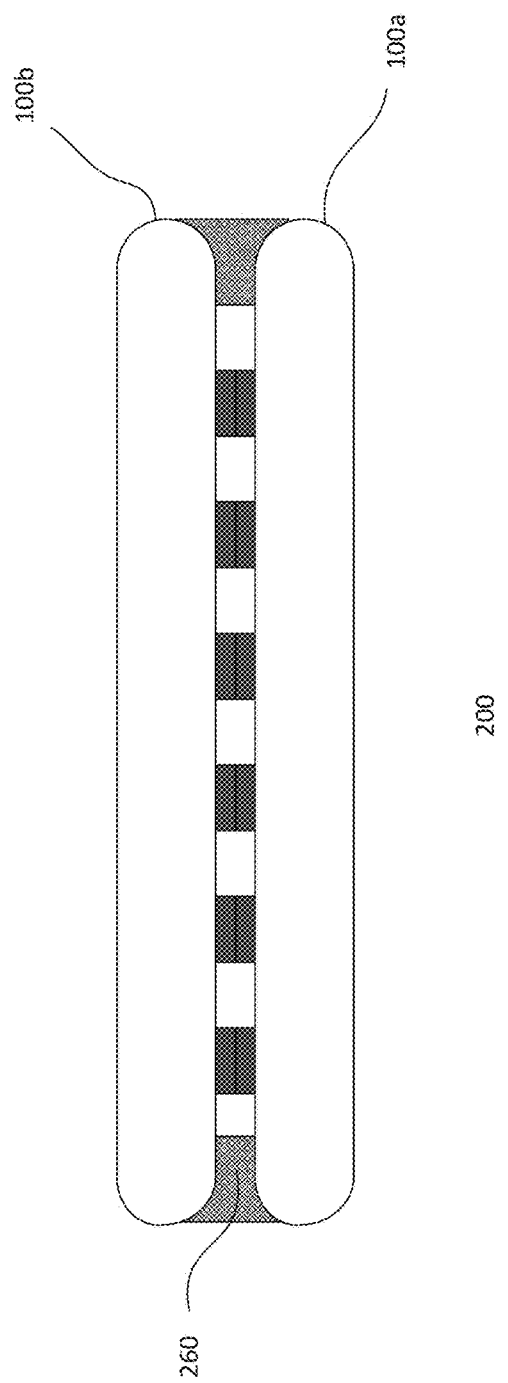

FIGS. 2a-b show an embodiment of a process 200 for stacking wafers. The wafers are similar to those described in FIGS. 1a-c. Common elements may not be described or described in detail.

Referring to FIG. 2a, first and second wafers 100a-b are provided. The wafers are similar to that described in FIGS. 1a-b. For example, one of the wafers includes a protection seal 260 disposed in an edge region of the wafer. In one embodiment, the protection seal is a pliable seal, such as a polymeric seal. The wafer 100a with the protection seal on its edge region may serve as the base wafer. The base wafer may be, for example placed on a stationary plate while the other wafer 100b without a protection seal is moved towards it and pressed against it to form a wafer stack.

In other implementations, both wafers, for example, may have a protection seal disposed on its respective mounting surfaces and pressed together to form the device stack. In such cases, the shapes of the protection seals of the different wafers should be the same to enable mating to each other. In yet other embodiments, protection seals of the different wafers may be different. For example, one may be rigid while the other is a pliable protection seal. The base wafer may have a non-rigid seal while the other wafer has a rigid seal. Providing the base wafer with a rigid seal and the other wafer with a non-rigid seal may also be useful. Similarly, the shapes of the protection seals of the different wafers should be the same to enable mating to each other. Additionally, the non-rigid protection seal has a height to enable bonding with the rigid protection seal.

As described, first and second wafers 100a-b are provided for forming a wafer stack with two wafers. One of the wafers serve as a base wafer. The base wafer, for example, is bottom wafer of the stack. The base wafer includes external contacts for mounting onto a circuit board or a package substrate. The external contacts may be, for example, solder bumps, solder balls or wire bond terminal pads. In one embodiment, at least the base wafer includes TSV contacts. Providing both wafers with TSV vial contacts may also be useful. In some cases, the stack may include n number of wafers, where n is a whole number greater than one. For example, in the case where n is >2, then at least the base and intermediate wafers below the top wafer of the stack include TSV contacts. As shown, the wafers are of the same size. Providing wafers of different sizes may also be useful. For example, one wafer may be slightly smaller than the other wafer.

In FIG. 2b, the first and second wafers are bonded together. One wafer may be fixed while the other is moved into position for bonding. For example, the second wafer is moved into position onto the first (fixed) wafer and bonded. Other configurations of bonding the wafers may also be useful. For example, both wafers may be moved into position. As shown, the active surfaces of the wafers face each other. For example, the device seals of the wafers are aligned for bonding. In other embodiments, the inactive or bottom surface of one wafer may face the active or top surface of another wafer as they are moved into position for bonding. In such cases, the inactive surface of the wafer may be processed to include electrical connections such as wafer bumps, RDL, etc., prior to bonding to the other wafer. Protection seals may also be formed on the inactive surface of the wafer.

The wafers are bonded together. The wafers may be aligned prior to bonding. The wafers may be bonded by bonding processes such as eutectic bonding, thermocompression bonding, solder bonding, glass frit bonding, UV-cured polymer, thermally cured polymer etc. In an embodiment, the wafers may be subjected to first wafer bonding process that bonds the device seals of the wafers. In such instance, the wafers may be bonded in an orientation where the top or active surfaces of the wafers face each other, e.g., wafer top surface-to-top-surface orientation.

The wafer may then be subjected to a second wafer bonding process that bonds the polymeric protection seal on the base wafer to the second wafer. For example, the first wafer bonding process may be eutectic bonding while the second wafer bonding process may be a thermally cured polymer bonding process. The bonding process may include various process conditions such as, for example, temperature, pressure, environment (N2, forming gas, vacuum, etc.). Other methods for bonding the wafers may also be useful. For example, the wafers may be bonded in an orientation where the top or active surface of the first wafer faces the bottom or inactive surface of the second wafer, e.g., wafer top surface-to-bottom-surface orientation. In such orientation, the second wafer may be processed to include electrical connections such as, for example, contacts, RDL, etc., on its bottom surface. In some instances, the second wafer may be a capping wafer that may be a blank wafer that may be removed at later stages of processing.

The bonding process causes the protection seal on the first wafer to contact the second wafer and form a seal. For example, the protection seal fills the gap between the first and second wafers when positioned for bonding. The protection seal is compressed and expands laterally. In one embodiment, the protection seal extends outward to cover at least partially edges of the wafers. This advantageously forms a hermetic seal at the edge region of the wafer stack that protects the device seals and reduces or prevents damage to wafer edge from the bonding and subsequent processing.

In one embodiment, subsequent processing includes back grinding at least the base wafer to expose the bottom of the TSV contacts. A redistribution layer (RDL) may be formed over the inactive wafer surface. The RDL include conductive traces on an isolation layer and is covered by a passivation layer. Openings are provided in the RDL in which bumps are formed. This provides external connections to the device on the active side through the TSV contacts and RDL. Under Bump metallization may be employed to provide adhesion layer to the RDL and other layers such as a barrier layer, wettable layer, etc., in order to facilitate a subsequent bumping process.

The protection seal, as described, protects the devices in the device region from contamination due to the bumping process. Additionally, in the case of a pliable protection seal, the wafer edges are protected from damage during bumping process handling.

Figure 3A:
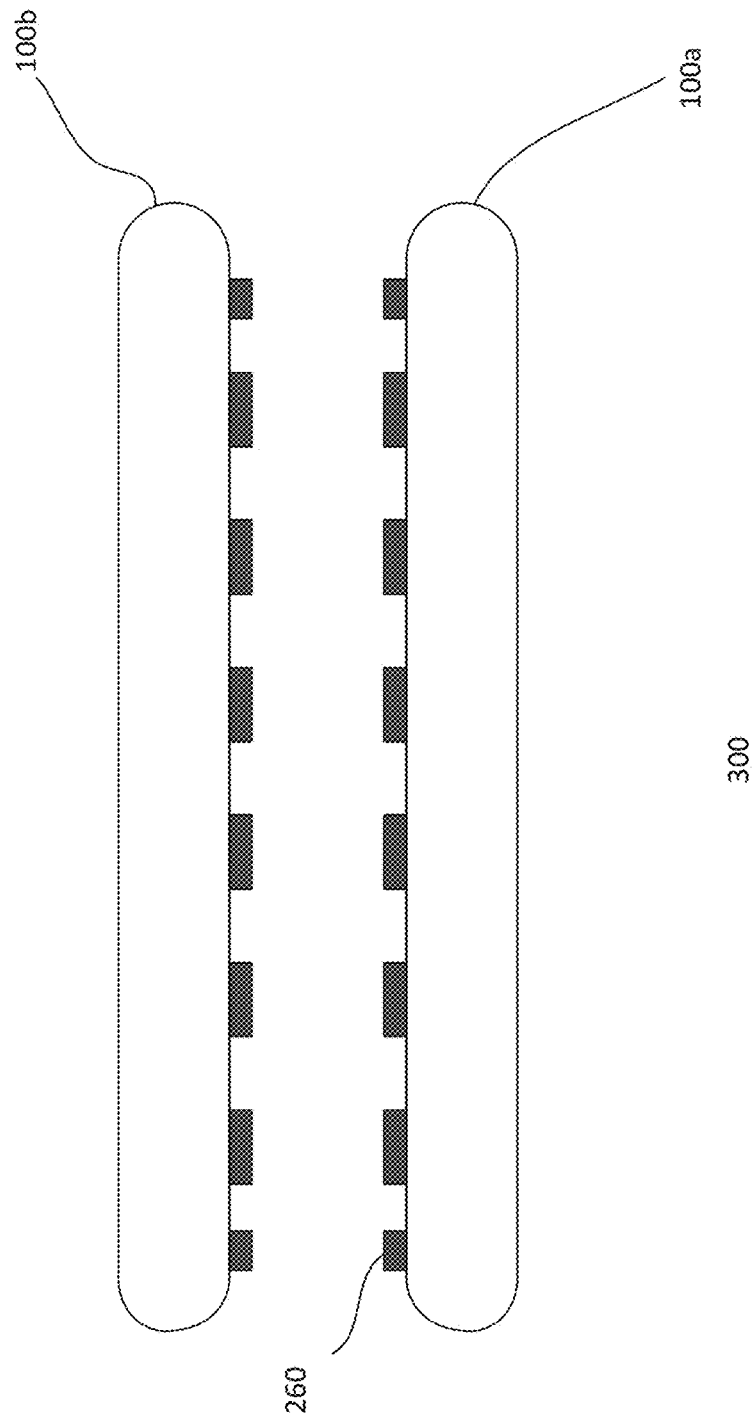
FIGS. 3a-b show another embodiment of a process for stacking wafers.
Figure 3B:
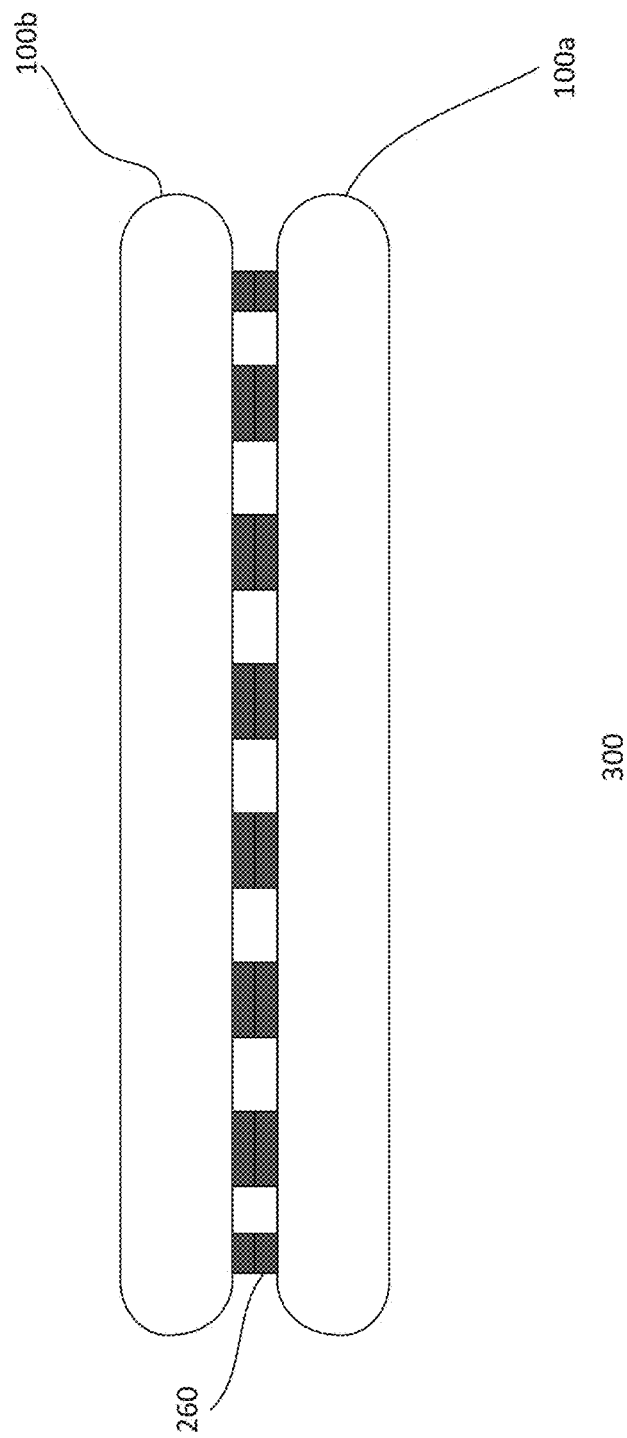

FIGS. 3a-b show another embodiment of a process 300 for stacking wafers. The process and wafers are similar to those described in FIGS. 1a-c and FIGS. 2a-b. Common elements may not be described or described in detail.

Referring to FIG. 3a, first and second wafers 100a-b are provided. The wafers are similar to those described in FIGS.

1a and 1c. For example, both the wafers includes a rigid protection seal 260 disposed in an edge region. In one embodiment, the rigid protection seal is a metal protection seal. The protection seal, for example, may be formed of a metal, such as aluminum, copper, gold, tin, their alloys or a combination thereof. Preferably, the protection seal is formed of the same material as the device seals. Providing a protection seal which is not the same material as the device seals may also be useful.

As shown in FIG. 3b, the first and second wafers are bonded together. The wafers are bonded together by, for example, eutectic bonding. In some embodiments, the wafers may be bonded by thermocompression bonding. Other methods for bonding the wafers may also be useful. In an embodiment where the protection seal and device seals are formed of the same material, the bonding process may be performed in the same step, i.e. single step, with the same process conditions (for example same temperature, pressure, etc). In other embodiments, where the protection seal and device seals are formed of different materials, the bonding process may include more than one step with different process conditions. For example, the device seals may be bonded in a first wafer bonding process followed by a second wafer bonding process to bond the protection seals on both wafers. The bonding process causes the protection seals on the first and second wafers to form a seal or a protection barrier.

Similar to the bonding process as described in FIGS. 2a-b, the wafers may be bonded in an orientation where the top or active surfaces of the wafers face each other, e.g., wafer top surface-to-top-surface orientation. In other embodiments, the wafers may be bonded in an orientation where the top or active surface of the first wafer faces the bottom or inactive surface of the second wafer, e.g., wafer top surface-to-bottom-surface orientation. In such orientation, the second wafer may be processed to include electrical connections such as, for example, contacts, RDL, etc., on its bottom surface. Additionally, protection seal may be formed on the bottom surface of the second wafer instead of the top surface.

After bonding, the wafer stack is subjected to subsequent processing. For example, subsequent processing includes back grinding at least the base wafer to expose the bottom of the TSV contacts. A redistribution layer (RDL) may be formed over the inactive wafer surface. The RDL include conductive traces on an isolation layer and is covered by a passivation layer. Openings are provided in the RDL in which bumps are formed. This provides external connections to the device on the active side through the TSV contacts and RDL. The protection seal, as described, protects the devices in the device region from contamination due to the bumping process.

In alternative embodiments, a wafer may be provided with n protection seals, where n is a whole number≥1. As described in FIGS. 1a-c, FIGS. 2a-b and FIGS. 3a-b, a wafer is provided with 1 protection seal (n=1). Providing a plurality of protection seals is also useful.

Figure 4A:
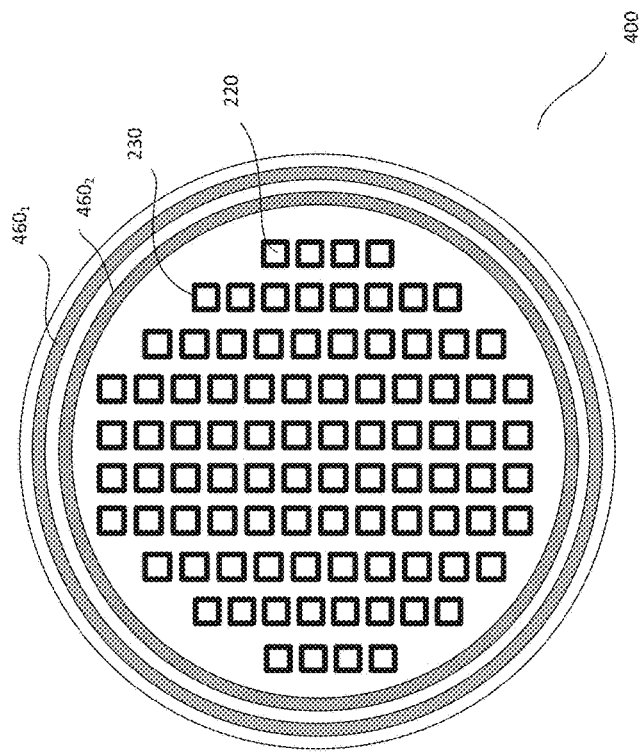
FIG. 4a-c show simplified plan and side views of alternative embodiments of a semiconductor wafer.
Figure 4B:
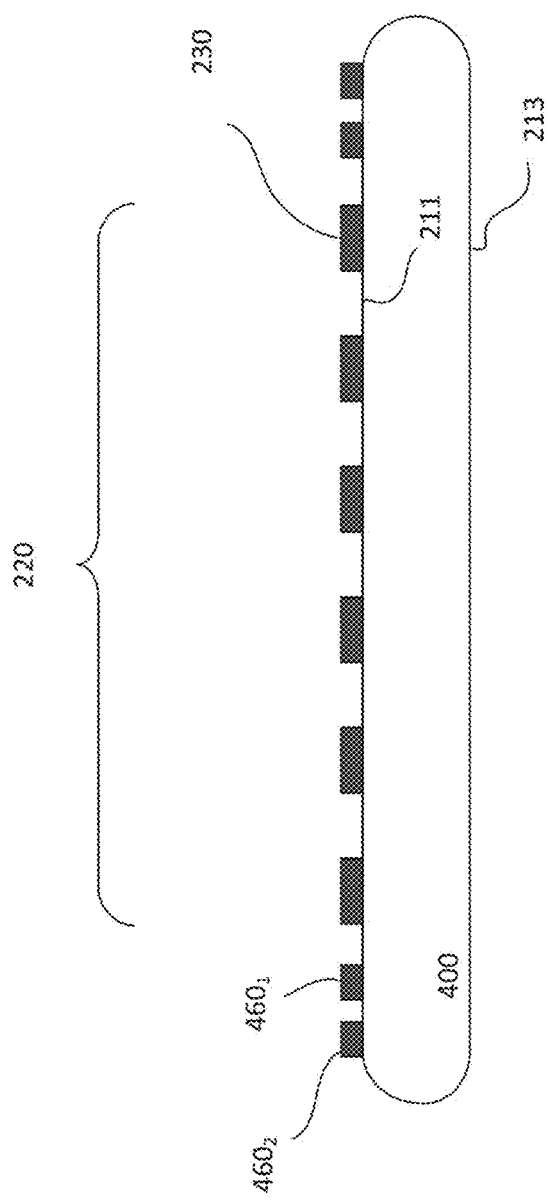
Figure 4C:
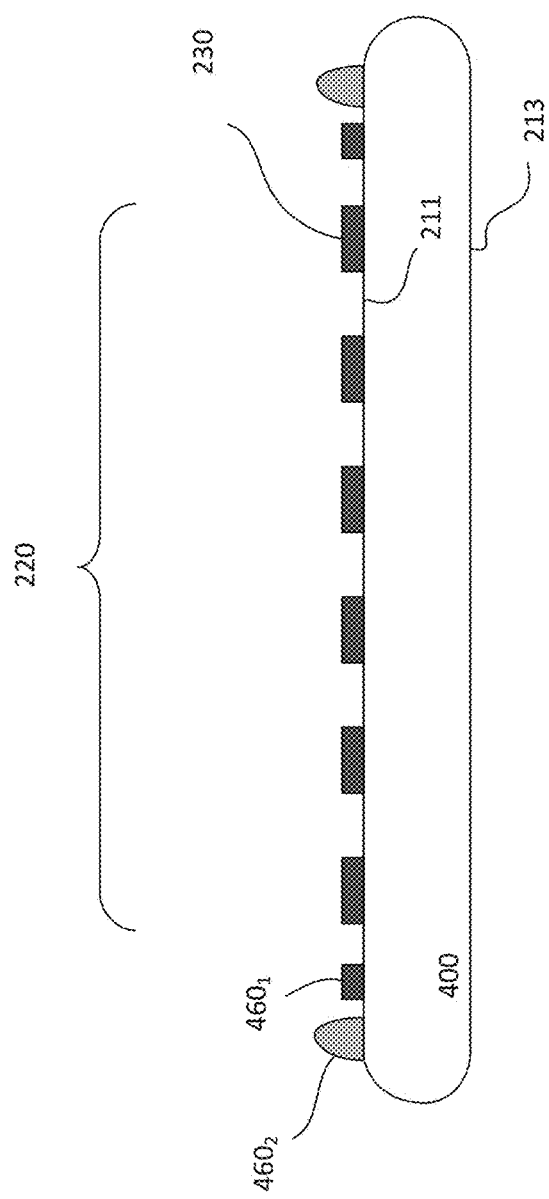

FIG. 4a shows a simplified plan view of alternative embodiment of a semiconductor wafer 400 while FIGS. 4b-c show corresponding side views of various embodiments of the semiconductor wafer. The wafer shown is similar to those described in FIGS. 1a-c. Common elements may not be described or described in detail.

The semiconductor wafer 400, for example, may be a silicon wafer. Other types of wafers may also be useful. The wafer, in one embodiment, is a processed wafer. For example, devices 220 are disposed on device region of an active surface 211 of the processed wafer. In one embodiment, the wafer is prepared for bonding with another wafer. For example, the wafer is prepared with TSV contacts (not shown) and device seals 230. A device seal surrounds a device. The device seals, for example, may be a metal, such as aluminum, copper, gold, tin, their alloys or a combination thereof. Other types of sealing material may also be useful.

As shown, wafer protection seals 460 are disposed on a surface of the wafer. The protection seal is disposed on the mounting surface of the wafer. The mounting surface is the surface on which another wafer is mounted. In one embodiment, the mounting surface is the active surface of the wafer. Providing other mounting surfaces may also be useful. For example, the mounting surface may be the inactive surface.

Protection seals 460, in one embodiment, are formed at the periphery of the wafer. The protection seals are disposed on the edge region outside of the die region. As shown, first and second protection seals $460_{1\text{-}2}$ (e.g., n=2) are provided in the edge region of the wafer. Providing other number of protection seals may also be useful (e.g., any n which is ≥1 or ≥2). The protection seals, as shown, are concentric ring shaped seals disposed in the edge region. The protection seals may have a circular shape. Alternatively, the concentric seals may have other ring shapes. Although the seals are described having the same shape, providing seals having different shapes may also be useful. Also, different seals may have different shapes.

In one embodiment, as shown in FIG. 4b, the protection seals are homogenous protection seals. For example, the protection seals 460 are rigid protection seals. The rigid protection seal are formed of, for example, a metal, such as aluminum, copper, gold, tin, their alloys or a combination thereof. Preferably, the protection seals 460 are formed of the same material as the device seals 230. As shown, the rigid protection seals 460 have the same height as the device seals 230. Preferably, the protection seals 460 are the same as the device seals. Providing protection seals which are different from the device seals is also useful. Providing protection seals which is a combination of the same and different material as the device seals is also useful. Other configurations of protection seals 460 are also useful. For example, the protection seals may be non-rigid protection seals, such as polymer protection seals.

In another embodiment, as shown in FIG. 4c, the protection seals 460 are hybrid protection seals. For example, the protection seals 460 include rigid and non-rigid or pliable protection seals. The rigid seal may be a metal and the pliable seal may be a polymer. Other rigid and pliable seals may also be useful. In one embodiment, the hybrid seal configuration includes a pliable seal for the outermost seal. As for the inner seal, it is a rigid seal. In the case where n is >2, the inner seals are rigid seals. Other configurations of seals may also be useful. For example, the outer seal may be rigid and the inner may be pliable. Additionally, the seals of the different wafers of the stack need not be the same type. However, they should have same or similar shapes for mating.

The wafers described in FIGS. 4a-c can be bonded as described in FIGS. 2a-b and 3a-b. In addition, subsequent processing on the wafer stack may be included. Such processing, for example, includes back grinding at least the base wafer to expose the TSV contacts, RDL and bumping.

The exemplary devices and methods may be employed in wafer level bonding to form a wafer stack with multiple wafers. In some cases, each wafer may be stacked in the same orientation where the top surface of one wafer faces the bottom surface of another wafer. For instance, the mounting surfaces may be a top surface of a wafer and a bottom surface of another wafer. In such instances, the bottom surface of the wafer may include a protection seal as well as electrical connections. In other cases, each wafer may be stacked in a different orientation. For example, the mounting surfaces may include the top and bottom surfaces of a wafer. Protection seals may be formed on both top and bottom surfaces of a wafer prior to bonding. The wafers of the wafer stack may have the same number or different number of protection seals. For example, the first and second bonded wafers at the base of the wafer stack may have two protection seals at the periphery of the wafers while the subsequent third and fourth bonded wafers of that wafer stack may have only one protection seal at the periphery of the wafers. Other configurations may also be useful. For example, the protection seals may be homogenous or hybrid of protection seals.

Figure 5A:
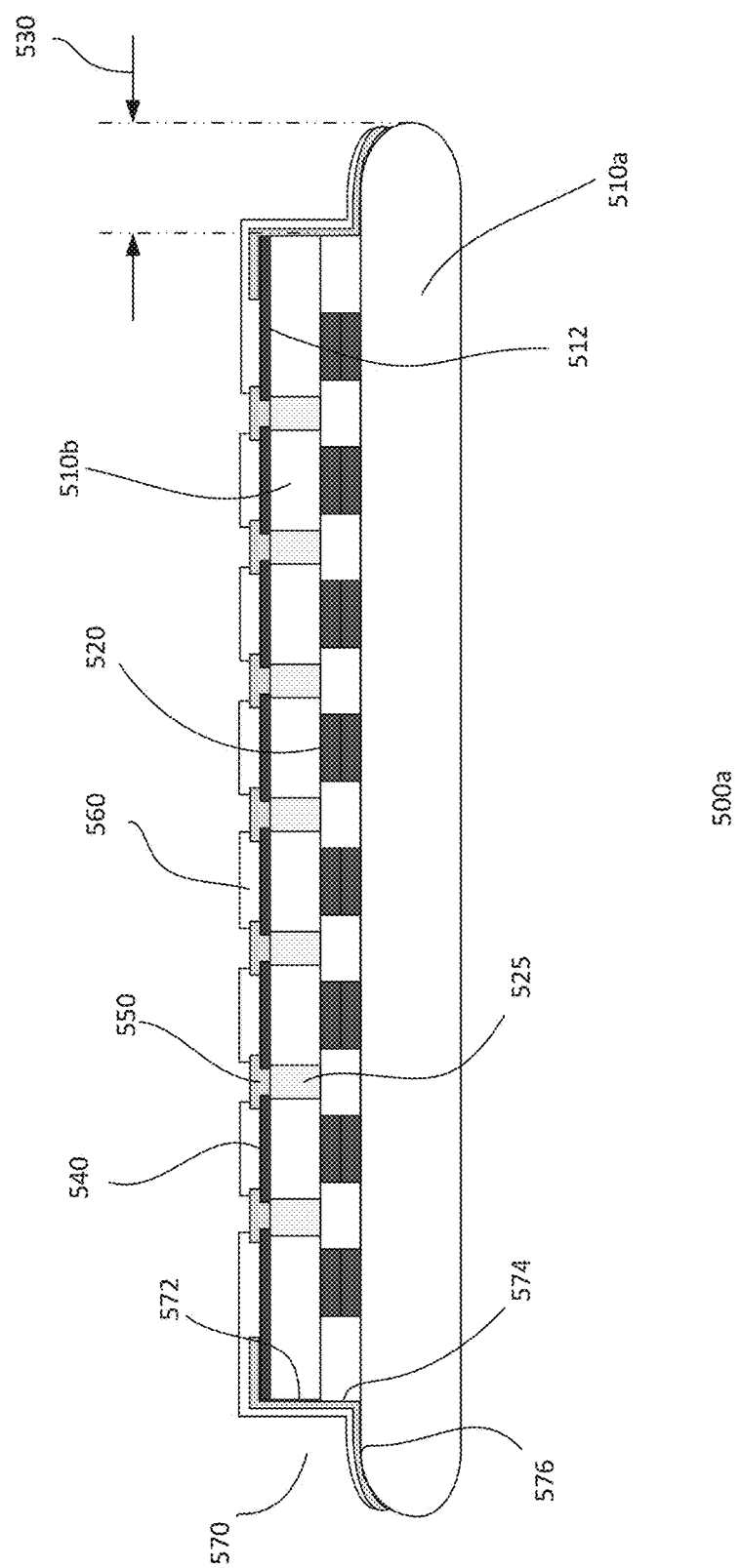
FIGS. 5a-5b show exemplary side views of embodiments of a wafer stack.

In yet another embodiment, the protection seal is formed after the wafers are bonded. FIG. 5a shows a simplified exemplary side view of an embodiment of a wafer stack 500a. The wafer stack may include two or more wafers bonded together. As illustrated, the wafer stack includes first and second wafers 510a and 510b bonded together, forming a wafer stack with two wafers. The first wafer 510a may be referred to as the base wafer of the wafer stack while the second wafer 510b may be referred to as the top wafer of the stack. Providing other number of wafers in the wafer stack may also be useful. In the case where there are more than two wafers in the stack, the wafer stack includes a base wafer, top wafer and one or more intermediate wafers between the top and bottom wafers.

The semiconductor wafers, for example, may be silicon wafers. Other types of wafers may also be useful. For example, the wafers may be a germanium (Ge), silicon-germanium alloy (SiGe), silicon-on-insulator (SOI), silicon-on-sapphire (SOS), gallium-arsenic (GaAs) or any other suitable semiconductor materials. The edges of the wafers may be beveled or rounded, as shown. Other types of edges may also be useful. The wafers may have a circular shape. Providing other shapes may also be useful.

The wafers, in one embodiment, are processed wafers. For example, devices 520 are disposed on the active surfaces of the processed wafers. The active surface may be referred to as the top surface while the opposing surface may be the inactive or bottom surface. The devices, for example, are formed in parallel. The devices, for example, are arranged in rows along a first (x) direction and columns along a second (y) direction. In one embodiment, full or complete devices are disposed on the active surface. For example, complete devices are disposed in a device or die region on the active surface of the wafer. An edge region surrounds the device region. The edge region may be devoid of devices. In some cases, incomplete devices may be included in the edge region. Incomplete devices are included to, for example, improve processing uniformity.

The wafers may include through silicon via (TSV) contacts 525 (shown in the bottom wafer). In one embodiment, the TSV contacts of the top or second wafer and the base or first wafer may be partially processed. For example, the TSV contacts of the wafers extend from the active (or top) surface and partially through the wafer. In other words, the bottom of the TSV contacts do not extend through to the inactive (or bottom) surface of the wafers. The top of the TSV contacts at the active surface may be exposed. In other embodiments, one or more wafers may be processed such that the top and bottom of the TSV contacts at the active and inactive surfaces of the wafers are exposed. The bottom wafer, in one embodiment, may be a functional integrated circuit. For example, the bottom wafer may be a functional integrated circuit that communicates with the top wafer. The TSV contacts may be formed of copper. Providing TSV contacts formed of other material may also be useful.

Additionally the wafers of the wafer stack may include device seals. A device seal surrounds a device. The device seals, for example, may be a metal, such as aluminum, copper, gold, tin, their alloys or a combination thereof. Other types of sealing material may also be useful. The device seals may be formed on the wafer to, for example, seal and protect the devices and interconnects on the wafer from environmental conditions of subsequent processing steps. The device seals may be formed by, for example, deposition, plating, mask and etch processes. Other methods for forming the device seals may also be useful. The device seals may be formed on the active surface of the wafer. In other embodiments, the device seals may be formed on a dielectric layer on the active surface of the wafer. The device seals may have a height of about 5 um. Other heights may also be useful. For example, depending on the type of seal used, the device seals may range up to hundreds of microns. In other embodiments, the device seals may not be necessary.

As illustrated, the top and base wafers of the wafer stack are of different sizes. In one embodiment, the base or bottom wafer is wider than the top wafer. For example, the bottom wafer has a larger diameter than the top wafer. The base wafer may be wider than the top wafer by a first width 530 from the peripheral edge of the top wafer. For example, the diameter of the bottom wafer is larger by 2× first width than the top wafer. The first width is a circumferential width surrounding the top wafer. For example, the circumference of the base wafer is wider than the top wafer by the first width from the peripheral edge of the top wafer. Providing a base wafer wider than the top wafer results in a step edge in the wafer stack. The first width may be smaller than the area occupied by incomplete devices. In other cases, the first width may be larger than the area occupied by incomplete devices. The first width may be, for example, 0.2 mm to 1.5 mm. Providing other widths may also be useful. Providing a base wafer which is wider than the top wafer results an exposed or unbonded area on the bonding surface of the base wafer. In the case where there are more than two wafers (e.g., n>2), the base wafer is wider than the top and one or more intermediate wafers by the first width from the peripheral edge of the top wafer. For example, the top and intermediate wafers may have the same size. This creates a step edge in the wafer stack. Other configurations of the different sizes of the wafer in the stack may also be useful. For example, the top, intermediate and bottom wafers may be of different sizes where the base wafer is wider than the top wafer by the first width from the peripheral edge of the top wafer while creating a step edge in the wafer stack.

In one embodiment, a first layer 540 may be disposed on a top surface of the wafer stack. The top surface of the wafer stack, for example, is the non-bonding surface 512 of the top wafer in the stack. For example, the first layer is disposed on the top wafer of the wafer stack. The first layer may be an isolation layer. In one embodiment, the isolation layer may be a patterned isolation layer. For example, the patterned isolation layer provides via openings for forming connections to the TSVs in the top wafer. The isolation layer serves as a via isolation layer for the TSVs in the top wafer. For example, the isolation layer isolates and redefines the TSVs in the top wafer. The isolation layer may be formed of silicon oxide. Providing an isolation layer formed of other types of material may also be useful.

In one embodiment, the wafer stack includes one or more layers disposed on the wafer stack covering the step edge of the wafer stack. The one or more layers are disposed on the top wafer of the stack and extend over the step edge of the wafer stack. For example, the one or more layers are disposed over the patterned first layer on the top surface of the wafer stack. The one or more layers extend to the peripheral side of the top wafer a portion, vertical gap between the top and base wafers and further cover the unbonded area on the bonding surface of the base wafer in the stack. In one embodiment, the portion 570 of the one or more layers covering the step edge of the wafer stack serves as an edge protection seal of the wafer stack. For example, the portion of the one or more layers disposed on the peripheral side of the wafer stack and extends to cover a portion of the base wafer serves as the edge protection seal on the wafer stack.

In one embodiment, the one or more layers disposed on the wafer stack covering the step edge of the wafer stack include second and third layers 550 and 560. For example, the second and third layers are disposed on the top wafer of the wafer stack and extend to cover the peripheral side of the top wafer 572, vertical gap 574 between the top and base wafers and a portion 576 of the base wafer. The second and third layers are formed of different materials. In one embodiment, the second layer may be formed of metal while the third layer may be formed of dielectric. For example, the second layer may be formed of aluminum, copper, gold, tin, their alloys or a combination. The third layer may be formed of silicon nitride, silicon oxide, nitrides, oxides or a combination thereof. Providing other materials for the second and third layers may also be useful. Additionally, providing other types and number of layers on the top surface of the wafer stack may also be useful.

The portion of the second layer disposed on the top wafer may serve as a redistribution layer of the top wafer while the portion of the third layer disposed on the top wafer may be a passivation layer of the top wafer. As for the portion of the second and third layers disposed on the peripheral side of the top wafer 572, vertical gap 574 between the top and base wafers and a portion of the base wafer, it serves as the edge protection seal of the wafer stack. For example, the edge protection seal of the wafer stack is a composite protection seal. The edge protection seal is a seal which extends from the redistribution and passivation layers disposed on the top wafer of the wafer stack. The edge protection seal is formed of the same material and of the same processing step as the second and third layers disposed on the top wafer of the wafer stack. As described, the base wafer has a different size relative to the top wafer by a first width from the peripheral edge of the top wafer, creating a step edge of the wafer stack. The portion of the second and third layers covering the step edge forms the edge protection seal. In other embodiments, the edge protection seal may be formed of one of the second and third layers disposed on the top wafer. For example, the edge protection seal may be a seal which extends from one of the redistribution and passivation layers disposed on the top wafer of the wafer stack.

The edge protection seal has a thickness that enables sealing of the vertical gap between the top and base wafers of the wafer stack. For example, the thickness of the edge protection seal seals the gap between the top and base wafers of the wafer stack. For example, the thickness or combined thickness of the one or more layers disposed on the side of the wafer stack may be 1 um to 10 um. Other thicknesses of the edge protection seal may also be useful. The thickness may depend on the technology node and type of material used.

Figure 5B:
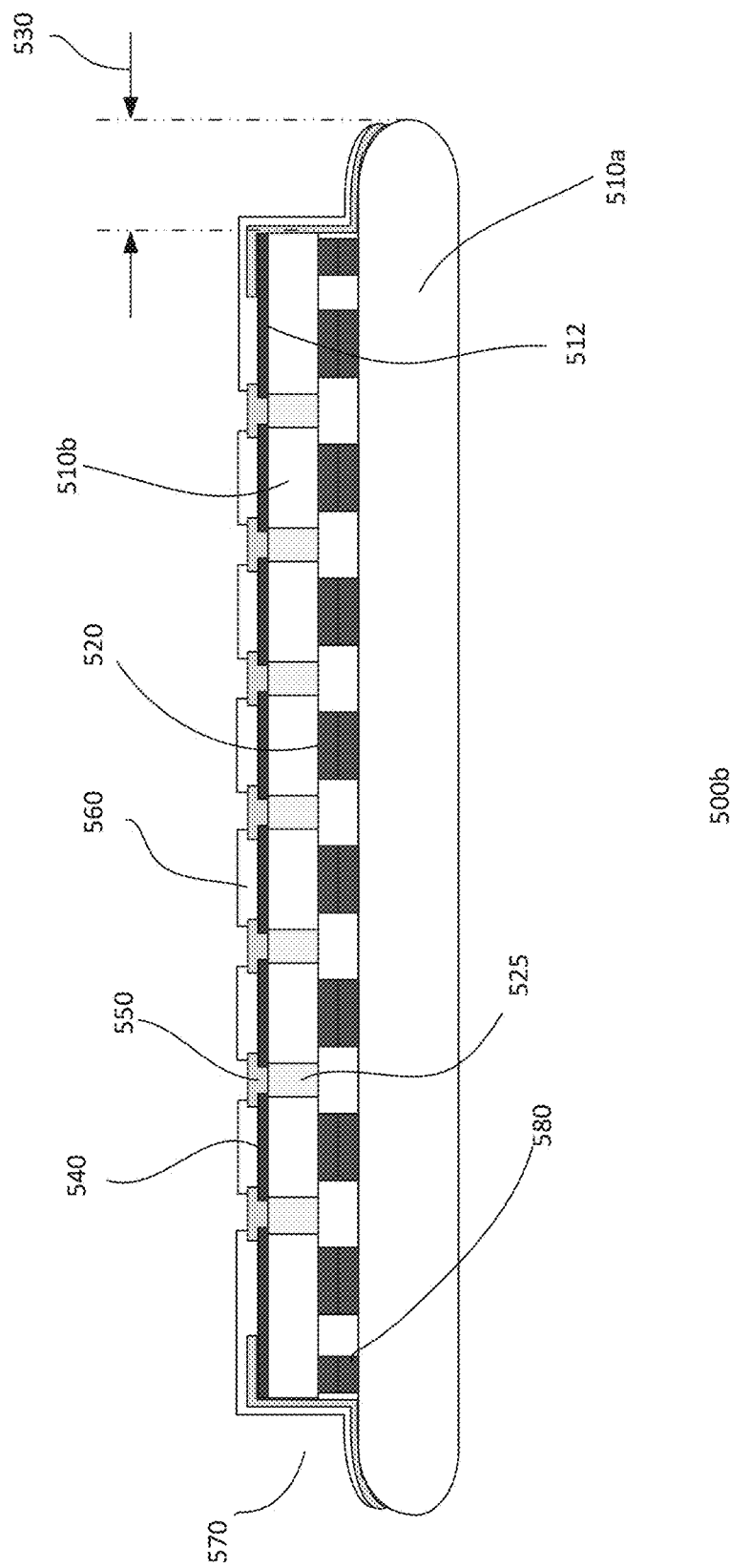

FIG. 5b shows a simplified exemplary side view of another embodiment of a wafer stack 500b. The wafer stack is similar to that described in FIG. 5a. Common elements may not be described or described in detail.

Referring to FIG. 5b, the wafer stack includes first and second wafers 510a and 510b bonded together, forming a wafer stack with two wafers. Providing other number of wafers in the wafer stack may also be useful. Devices 520 may be disposed on an active surface of the processed wafers. A device seal may surround a device. Additionally, the wafers may include through silicon via (TSV) contacts. As illustrated, the top and base wafers of the wafer stack are of different sizes, resulting in a step edge in the wafer stack.

The wafer stack 500b, in one embodiment, includes a protection seal ring 580. The protection seal ring, for example, has a continuous ring structure. The seal ring, for example, surrounds the devices and device seals in the device region. The protection seal ring is disposed at a predefined distance from the peripheral edge of the base wafer. Alternatively, the protection seal ring is disposed at a predefined distance from the peripheral edge of the top wafer. The seal ring, in one embodiment, is formed of a rigid material such as metal. In another embodiment, the seal ring may be a pliable protection seal formed, for example, of a polymeric material. Providing other number of seal rings between the top and base wafers in the wafer stack may also be useful. Other configurations of the seal rings may also be useful. For example, the protection seal rings may be formed of a metal seal ring and a polymer seal ring (e.g., hybrid seal rings) such as those described in FIGS. 4a-4c.

Similar to wafer stack 500a in FIG. 5a, a first layer 540 may be disposed on the top wafer of the wafer stack 500b. The first layer may be a patterned isolation layer. For example, the patterned isolation layer provides via openings for forming connections to the TSVs in the top wafer. The wafer stack 500b includes one or more layers disposed on the wafer stack covering the step edge of the wafer stack. The portion 570 of the one or more layers covering the step edge of the wafer stack serves as an edge protection seal of the wafer stack. For example, the portion of the one or more layers disposed on the peripheral side of the wafer stack and extends to cover a portion of the base wafer serves as the edge protection seal on the wafer stack.

Various techniques may be employed to form the edge protection seal on the wafer stack. For example, the edge protection seal may be disposed on the step edge of the wafer stack during deposition of the second and third layers on the top surface of the wafer stack. The second and third layers may be formed by sputtering. Other techniques may include, for example, plating, deposition, spin coating, spraying, electroless-plating.

FIGS. 6a-g show an embodiment of a process 600 for a forming an edge protection seal on a wafer stack. The wafers of the stack are similar to those described in FIG. 5. Common elements may not be described or described in detail.

Figure 6A:
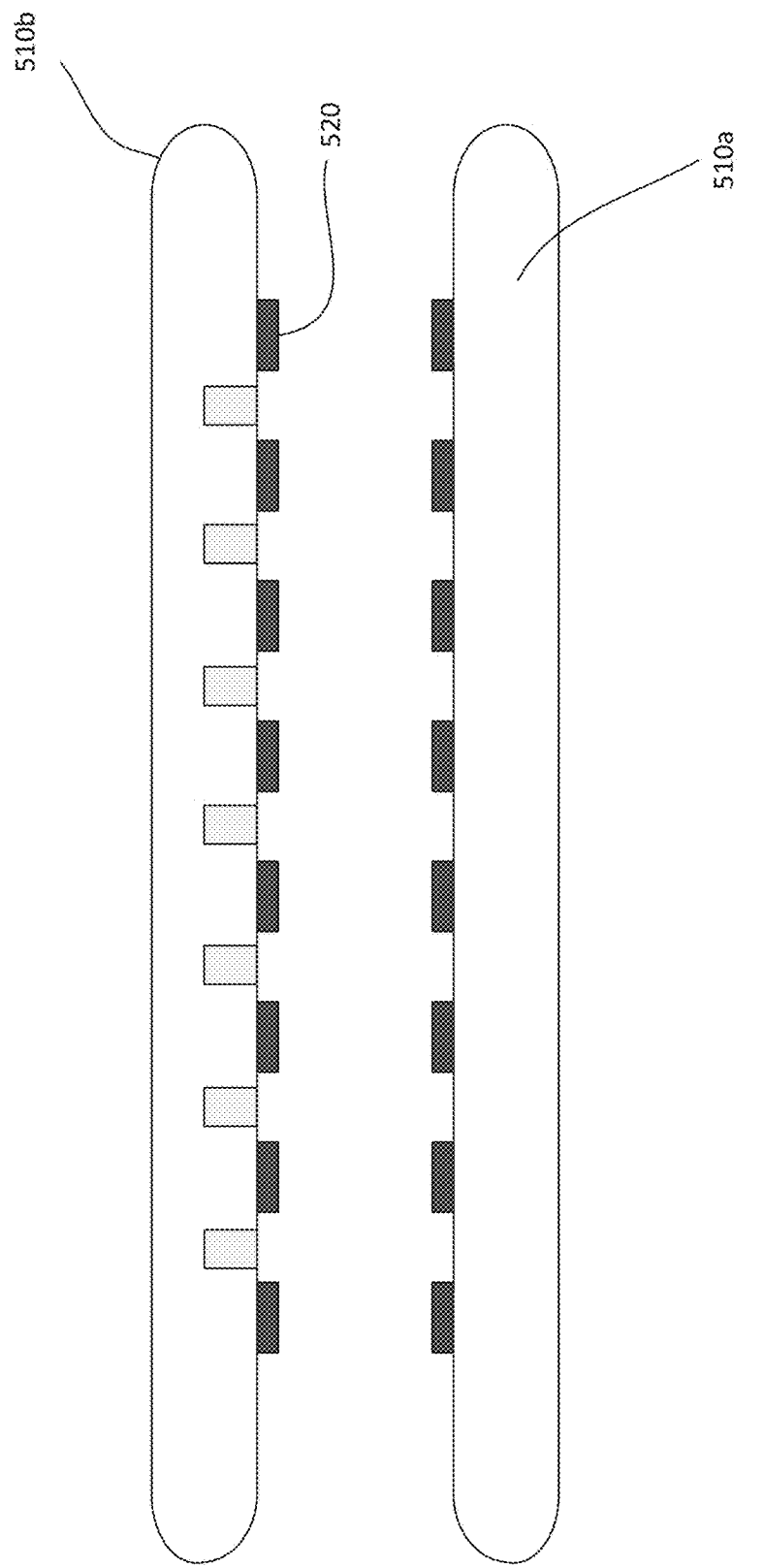

Referring to FIG. 6a, first and second wafers 510a-510b are provided for bonding. The first and second wafers are bonded for forming a wafer stack with two wafers. In other embodiments, multiple wafers are provided for forming the wafer stack. For example, more than two wafers may be provided for bonding. One of the wafers serves as a base wafer. For example, the first wafer 510a may serve as the base wafer. The base wafer, for example, is a bottom wafer of the stack on which other wafers are mounted. For example, the second or top wafer 510*b* is mounted onto the base wafer.

In one embodiment, the wafers are processed wafers. For example, devices 520 are disposed on an active surface of the processed wafer. For example, complete devices are disposed in a device or die region on the active surface of the wafer. An edge region surrounds the device region. The edge region may be devoid of devices. In some cases, incomplete devices may be included in the edge region.

Additionally the wafers of the wafer stack may include device seals. A device seal surrounds a device. The device seals, for example, may be a metal, such as aluminum, copper, gold, tin, their alloys or a combination thereof. Other types of sealing material may also be useful. The device seals may be formed on the active surface of the wafer. In other embodiments, the device seals may be formed on a dielectric layer on the active surface of the wafer. The device seals may have a height of about 5 um. Other heights may also be useful. For example, depending on the type of seal used, the device seals may range up to hundreds of microns. In other embodiments, the device seals may not be necessary.

The wafers, in one embodiment, include TSV contacts. For example, both the first and second wafers 510*a*-510*b* includes TSV contacts (not shown for second wafer). The top of the TSV contacts at the active surface may be exposed. The TSV contacts may extend from the active (or top) surface and partially through the wafer. In other words, the bottom of the TSV contacts do not extend through to the inactive (or bottom) surface of the wafers. Providing TSV contacts with its bottom exposed may also be useful. For instance, the bottom of the TSV contacts at the inactive surface of the base wafer may be exposed. The bottom wafer may be a functional integrated circuit that communicates with the top wafer. In other embodiments, at least the top wafer includes TSV contact. For example, the base wafer may be processed without TSV contacts.

In one embodiment, the wafers may include one or more protection seal rings similar to those described in FIGS. 1*a*-1*c* and FIGS. 4*a*-4*c* (not shown). The protection seal rings, for example, have a continuous ring structure. The seal rings, for example, surround the devices and device seals in the device region. The seal rings may be formed on the bonding surface of the wafers prior to bonding. For example, the seal rings may be formed on the active surface of the wafers prior to bonding. The protection seal rings, for example, may be formed at a predefined distance from the peripheral edge of the base wafer. Alternatively, the seal rings are formed at a predefined distance from the peripheral edge of the top wafer. The seal rings, in one embodiment, are formed of a rigid material such as metal. In another embodiment, the seal rings may be a pliable protection seal formed, for example, of a polymeric material. In yet another embodiment, the protection seal rings may be a combination of a metal seal ring and a polymer seal ring (e.g., hybrid protection seals). Other configurations of the seal rings may also be useful. For example, only one of the wafers includes one or more seal rings formed on its bonding surface prior to bonding. Providing the wafers without protection seal rings prior to bonding may also be useful.

Figure 6B:
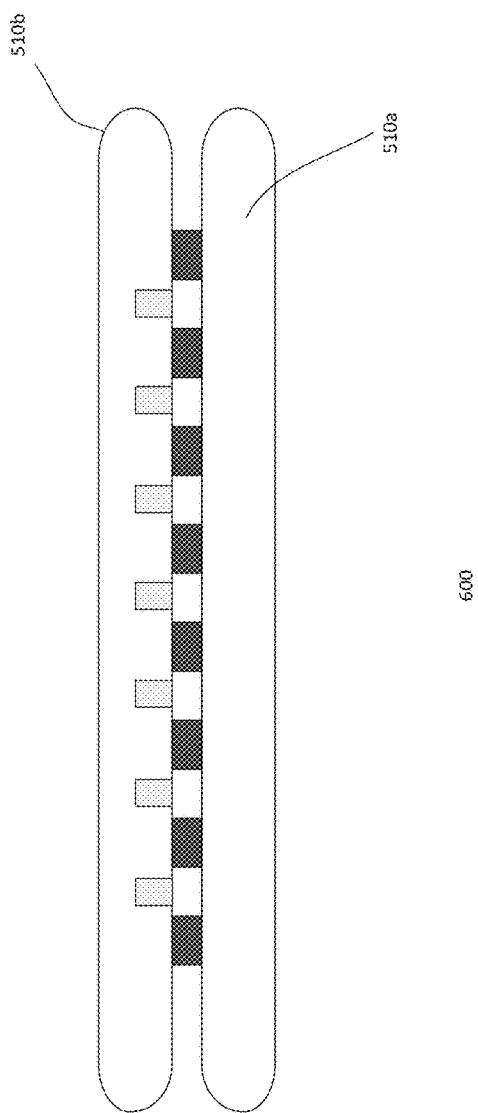

As shown, the wafers are about the same size. For example, the wafers are about the same size prior to bonding. Providing wafers of different sizes may also be useful. For example, one wafer may be slightly smaller than the other wafer. In FIG. 6*b*, the first and second wafers are bonded together. One wafer may be fixed while the other is moved into position for bonding. The base wafer may be, for example placed on a stationary plate while the top or second wafer is moved into position onto the first (fixed) wafer and bonded. Other configurations of bonding the wafers may also be useful. For example, both wafers may be moved into position. As shown, the active surfaces of the wafers face each other. For example, the device seals of the wafers are aligned for bonding.

The wafers may be bonded by bonding processes such as eutectic bonding, thermocompression bonding, solder bonding. Other methods for bonding the wafers may also be useful. For example, the wafers may be bonded by fusion bonding. In one embodiment, the bonding process bonds the device seals of the wafers.

Figure 6C:
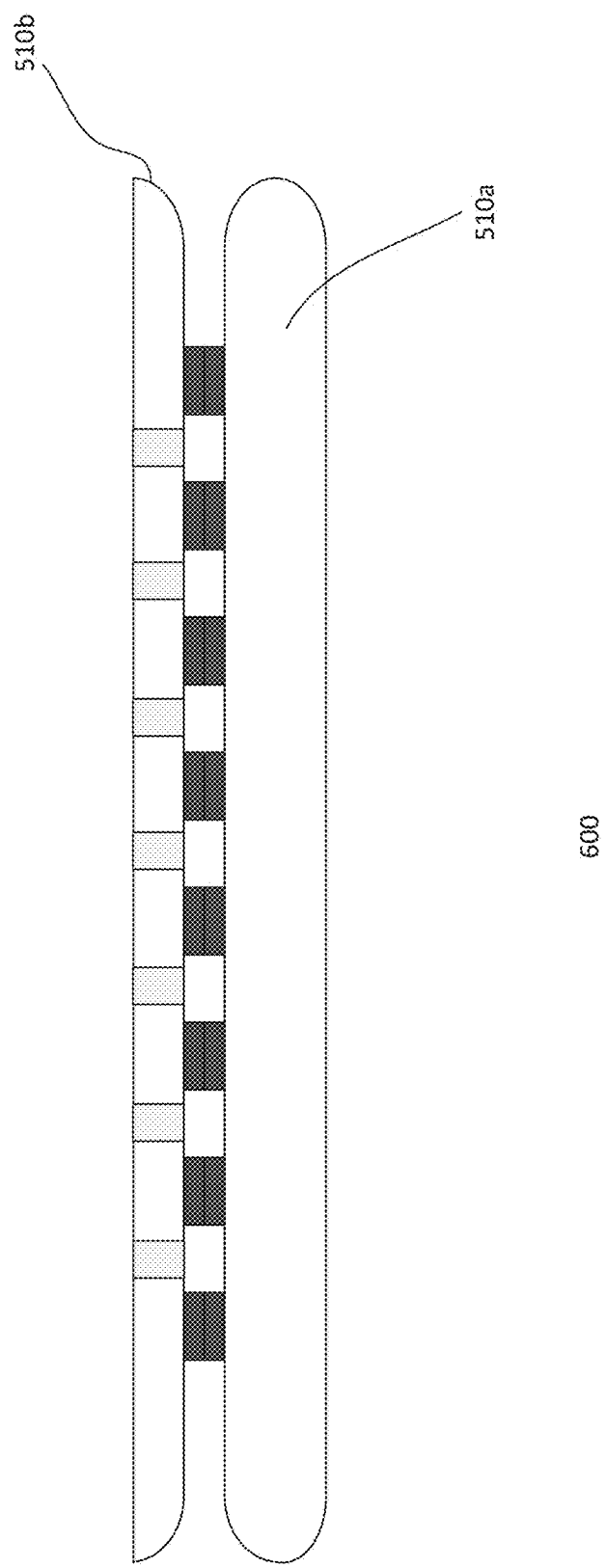

After bonding, the wafer stack is subjected to wafer back grinding. As shown in FIG. 6*c*, the top wafer is backgrinded. In one embodiment, the top wafer is backgrinded to reveal the TSV contacts. The top wafer is backgrinded at its non-bonding surface in the wafer stack. The non-bonding surface may be the inactive surface. Back grinding the inactive surface of the top wafer reduces the thickness of the wafer and exposes the TSV contact at the bottom surface of the wafer. For example, the top wafer of the wafer stack may be backgrinded until it reaches a thickness 5%-30% of its original thickness. Other thicknesses may also be useful. The wafer stack may be back grinded, for example, by polishing such as chemical mechanical polishing, dry polishing, wet polishing, etching. Performing wafer back grinding using other techniques may also be useful.

In FIG. 6*d*, edge trimming is performed. In one embodiment, the wafer stack is trimmed to remove a portion of the edge region of the top wafer. The wafer stack is positioned on a wafer chuck and rotated by the wafer chuck to trim a portion of the edge region of the top wafer. A portion of the edge region of the top wafer is trimmed as a blade moves around a predefined circumference of the top wafer when the wafer chuck rotates. In one embodiment, the top wafer is trimmed such that the removed portion of the top wafer exposes an area or portion of the base wafer. For example, the exposed area of the base wafer in the wafer stack has a circumferential first width 530 from the peripheral edge of the trimmed top wafer. The exposed area of the base wafer or first width may be about 0.2 mm to 1.5 mm. Other widths may also be useful. The first width, in one embodiment, is larger than an edge bit removal (EBR) portion. The EBR portion is a region of the wafer stack which is devoid of device. The width of the EBR portion may be about 0.2 mm to 5 mm. Other widths of the edge bit removal portion may also be useful. The first width, for example, may be larger than the EBR by about 0.05 mm to 0.1 mm. In other embodiments, the first width may be the same as the EBR portion. In yet other embodiments, the first width may be smaller than the EBR portion.

Trimming the edge of the top wafer results in different sized wafers in the bonded wafer stack and creates a step edge 620 of the wafer stack. For example, the trimming produces a wafer stack with a base wafer that is wider than the top wafer by a diameter 2× first width. The removed portion of the top wafer exposes the base wafer by the circumferential first width. In the case where there are more than two wafers, the base wafer is wider than the top and intermediate wafers after edge trimming. The base wafer is wider than the top wafer and intermediate wafers by the first width from the peripheral edge of the top wafer.

Figure 6E:
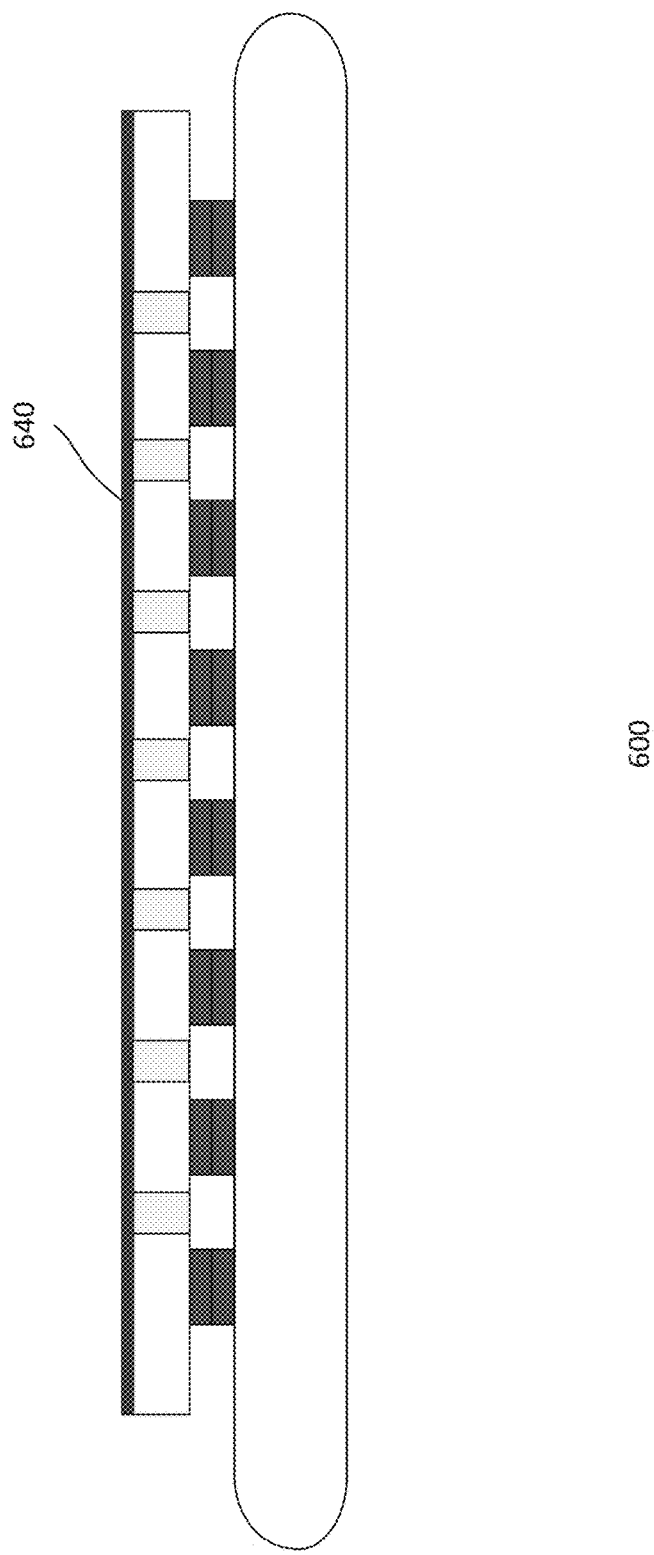

After edge trimming, a first layer 640 is deposited on the wafer stack. The first layer, in one embodiment, is an isolation layer. As shown in FIG. 6*e*, the isolation layer is deposited on the top wafer of the wafer stack. The isolation layer may be deposited on the backgrinded (or non-bonding) surface of the top wafer of the wafer stack. The isolation layer may be deposited such that it covers, for example, only the exposed surface of the top wafer, without covering the sides of the top wafer and the wider base wafer. For example, the isolation layer is not deposited on the sides of the top wafer and the exposed area of the base wafer. In one embodiment, the isolation layer may be a dielectric material. For example, the isolation layer may be a silicon oxide layer. The isolation layer may be deposited by oxide growth, spin on. Providing other materials for the isolation layer and deposition technique may also be useful. In some embodiments, the isolation layer may be subjected to a chemical mechanical polishing (CMP) process after deposition.

After deposition, the isolation layer is patterned to form via openings corresponding to the TSVs in the top wafer of the stack. The isolation layer may be patterned using, for example, mask and etch techniques. Other techniques may also be employed to pattern the isolation layer. The patterned isolation layer provides isolation between the TSVs. For example, the patterned isolation layer redefines openings of the TSVs to prevent shorting.

Figure 6F:
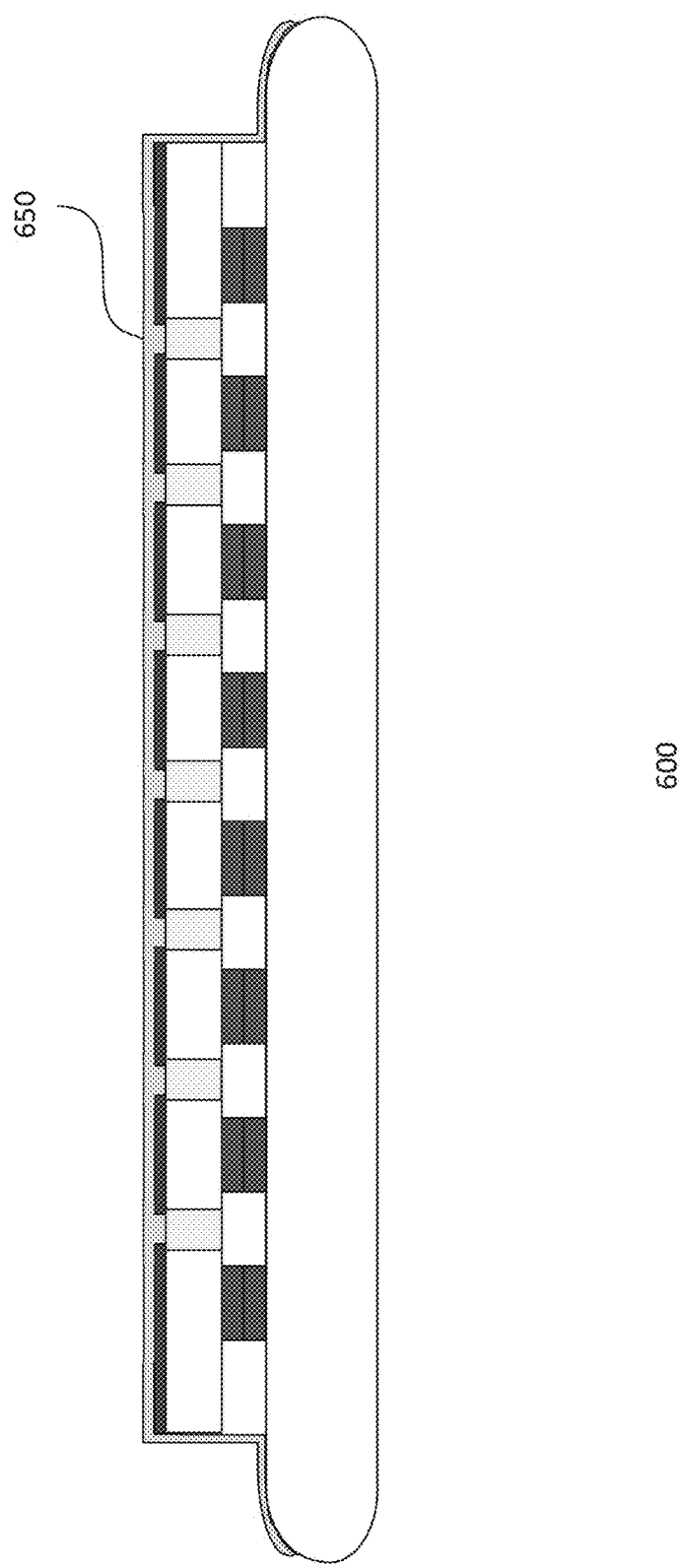

In one embodiment, a second layer 650 is deposited on the wafer stack as shown in FIG. 6f. The second layer is deposited over the first layer on the wafer stack, covering the top wafer and step edge of the wafer stack. For example, the second layer is deposited on the top wafer and extends downwards covering the peripheral side of the top wafer and the vertical gap between the top wafer and base wafer as well as a portion of the base wafer. The portion of the second layer deposited on the step edge seals the vertical gap between the top and base wafers of the wafer stack. The portion of the second layer on the peripheral side of the top wafer, the vertical gap between the top and base wafers and the portion of the base wafer forms a first protection layer of an edge protection seal of the wafer stack. The portion of the second layer formed on the top wafer of the wafer stack, in one embodiment, serves a redistribution layer (RDL) of the top wafer of the wafer stack. The redistribution layer fills the via openings. The second layer may be formed of metal. For example, the second layer may be formed of aluminum, copper, gold, tin, their alloys or a combination thereof. The second layer may be deposited using sputtering, PECVD. Other techniques for depositing the metal layer may also be useful.

The second layer is patterned after deposition to form the redistribution layer. In one embodiment, a third layer 660 is deposited on the top wafer of the wafer stack. The third layer is deposited on the patterned second layer. The third layer covers the second layer including the openings formed thereon on the top wafer and extends to the peripheral side of the top wafer, the gap between the top wafer and the base wafer, and a portion of the base wafer. In other words, the third layer is deposited on the top wafer and step edge of the wafer stack. The third layer, for example, is deposited directly on the second layer. The portion of the third layer on the peripheral side of the top wafer, vertical gap between the bonded wafers and the portion of the first width TE of the base wafer forms a second protection layer of the edge protection seal of the wafer stack. The portion of the third layer on the top wafer, in one embodiment, serves as the passivation layer of the top wafer. The third layer may be a dielectric layer. For example, the third layer may be formed of oxide or nitride. Providing other material for forming the second layer may also be useful.

The first and second protection layers at the peripheral side of the top wafer, gap between the top wafer and the base wafer, and a portion of the base wafer forms the edge protection seal of the wafer stack. The edge protection seal on the wafer stack forms a seal or a protection barrier that protects the devices in the stack from damage or contamination during bumping process handling. This advantageously forms a hermetic seal at the edge of the wafer stack that protects the devices and reduces or prevents damage from subsequent processing. The edge protection seal, in one embodiment, is a composite protection seal formed of two different layers such as the metal and dielectric layers. Alternatively, the edge protection seal may be formed only of the second layer 650 or third layer 660 of the wafer stack. For example, the edge protection seal may be formed of only the layer used in forming the redistribution layer such as the metal layer. In such case, the third layer is only deposited to cover the top wafer, serving as a passivation layer and does not extend to cover the step edge of the wafer stack.

Figure 6G:
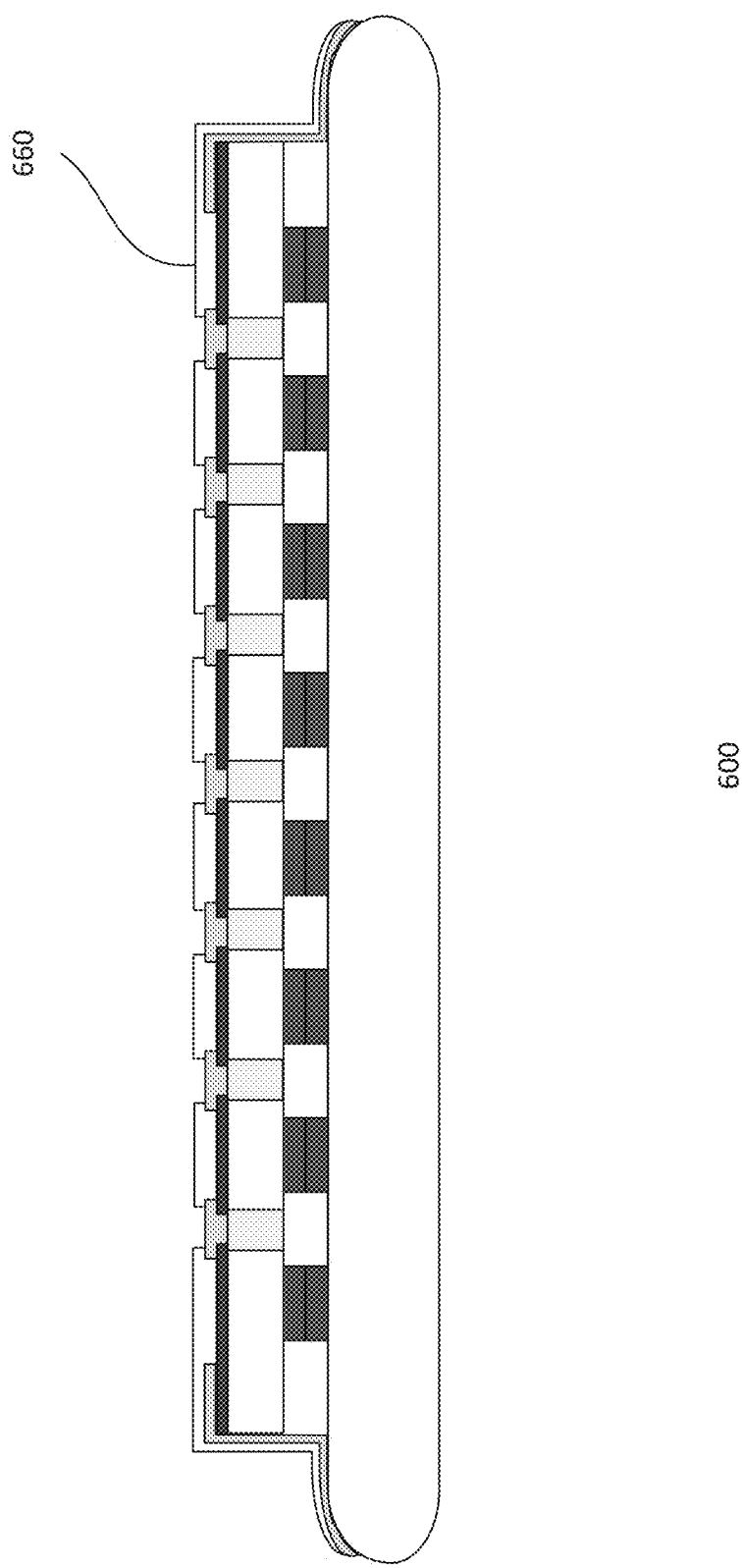

As shown in FIG. 6g, the third layer is patterned to form openings corresponding to portions of the metal layer for forming interconnection. In one embodiment, subsequent processing includes back grinding the base wafer to expose the bottom of the TSV contacts. A redistribution layer (RDL) may be formed over the inactive wafer surface of the base wafer. The RDL include conductive traces on an isolation layer and is covered by a passivation layer. Openings are provided in the RDL in which bumps are formed. This provides external connections to the device on the active side through the TSV contacts and RDL. Under Bump metallization may be employed on the top and base wafers to provide adhesion layer to the RDL and other layers such as a barrier layer, wettable layer, etc., in order to facilitate a subsequent bumping process.

Further, although the embodiments of the present disclosure are employed at the current 300 mm technology node, the embodiments may be extended to include other technology nodes, including any future nodes such as, for example, 450 mm, 600 mm, etc.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor device, comprising:
    providing first and second wafers of a wafer stack, the first and second wafers having first and second major surfaces, the wafers include edge and non-edge regions, wherein the first and second wafers include devices formed in the non-edge region, the first wafer serves as the base wafer while the second wafer serves as the top wafer of the wafer stack;
    forming device seals on the first major surfaces of the first and second wafers in the non-edge region, wherein the device seals surround the devices in the non-edge region of the first and second wafers;
    bonding the first and second wafers to form the wafer stack, wherein the first major surfaces of the first and second wafers face each other and the device seals are aligned for bonding;

forming a step edge of the wafer stack such that the base wafer is wider than the top wafer in the wafer stack to provide the step edge; and forming an edge protection seal covering the step edge of the wafer stack comprising depositing a first layer on the wafer stack including at the top wafer and step edge of the wafer stack, wherein the first layer covers the second major surface of the top wafer completely and peripheral side of the top wafer, gap between the top and base wafers and a portion of the base wafer, and depositing a second layer on the wafer stack, wherein the second layer is deposited over the first layer at the top wafer and step edge of the wafer stack, wherein the portion of the first and second layers on the step edge of the wafer stack forms the edge protection seal which protects the devices in the wafer stack in subsequent processing.

2. The method of claim 1 further comprising patterning the first layer to form openings prior to depositing the second layer.

3. The method of claim 2 wherein the portion of the first layer deposited on the top wafer of the wafer stack serves as a redistribution layer of the top wafer.

4. The method of claim 1 further comprising back grinding the top wafer to expose TSV contacts in the top wafer.

5. The method of claim 1 wherein forming the step edge of the wafer stack comprises trimming the top wafer of the wafer stack such that the base wafer is wider than the top wafer by a first width from the peripheral side of the top wafer to provide the step edge.

6. The method of claim 1 wherein the first layer deposited on the wafer stack is a metal layer.

7. The method of claim 1 wherein the first layer is deposited by sputtering.

8. The method of claim 1 further comprising patterning the second layer.

9. The method of claim 8 wherein the portion of the second layer deposited over the top wafer of the wafer stack further serves as a passivation layer of the top wafer.

10. The method of claim 1 wherein the second layer deposited on the wafer stack is a dielectric layer.

11. The method of claim 1 further comprising depositing an isolation layer on the top wafer of the wafer stack and patterning the isolation layer to form openings corresponding to through silicon vias in the top wafer prior to depositing the first layer on the wafer stack.

12. A method of forming a semiconductor device comprising:

providing first and second wafers of a wafer stack, the first and second wafers having first and second major surfaces, the wafers include edge and non-edge regions, wherein the first and second wafers include devices formed in the non-edge region, the first wafer serves as the base wafer while the second wafer serves as the top wafer of the wafer stack;

forming device seals on the first major surfaces of the first and second wafers in the non-edge region, wherein the device seals surround the devices in the non-edge region of the first and second wafers;

bonding the first and second wafers to form the wafer stack, wherein the first major surfaces of the first and second wafers face each other and the device seals are aligned for bonding;

trimming the wafer stack, wherein a portion of the top wafer is trimmed such that the base wafer is wider than the top wafer by a first width from the peripheral side of the trimmed top wafer, forming a step edge of the wafer stack; and forming an edge protection seal covering the step edge of the wafer stack, wherein forming the edge protection seal comprises depositing a first layer on the wafer stack including the top wafer and step edge of the wafer stack, wherein the first layer covers the second major surface of the top wafer completely and peripheral side of the top wafer, gap between the top and base wafers and a portion of the base wafer, wherein the first layer on the peripheral side of the top wafer, gap between the top and base wafers and the portion of the base wafer protects the devices of the wafer stack in subsequent processing.

13. The method of claim 12 wherein forming the edge protection seal further comprises depositing a second layer on the first layer of the wafer stack, wherein the second layer is deposited over the top wafer and step edge of the wafer stack, the portion of the first and second layers on the step edge of the wafer stack forms the edge protection seal which protects the devices in subsequent processing.

14. The method of claim 12 further comprising back grinding the top wafer to expose TSV contacts in the top wafer.

15. The method of claim 12 wherein the portion of the first layer deposited on the second major surface of the top wafer of the wafer stack serves as a redistribution layer of the top wafer and the portion of the second layer deposited on the first layer over the second major surface of the top wafer serves as a passivation layer.

16. The method of claim 15 wherein the first layer deposited on the wafer stack is formed of metal.

17. The method of claim 15 wherein the second layer deposited on the wafer stack is a dielectric layer.

18. A semiconductor wafer stack, comprising:

first and second wafers bonded together on their first major surfaces, the wafers include edge and non-edge regions, wherein the first and second wafers include devices and device seals that surround the devices in the non-edge region, the device seals are disposed on the first major surfaces of the first and second wafers, the first wafer serves as the base wafer while the second wafer serves as the top wafer of the wafer stack, wherein the base wafer is wider than the top wafer by a first width from the peripheral side of the top wafer, providing a step edge of the wafer stack; and an edge protection seal disposed on the wafer stack covering the step edge and protects the devices in the wafer stack in subsequent processing, wherein the edge protection seal comprises a first layer disposed on the step edge of the wafer stack covering a gap between the top and base wafers and extends to a portion of the base wafer.

19. The semiconductor wafer of claim 18 wherein the first layer further covers a second major surface of the top wafer of the wafer stack completely and serves as a redistribution layer on the top wafer.

20. The semiconductor wafer of claim 19 wherein the edge protection seal further comprises a second layer disposed over the first layer on the step edge of the wafer stack covering the gap between the top and base wafers and extends to the portion of the base wafer.

* * * * *